(12) United States Patent
Or-Bach et al.

(10) Patent No.: US 9,941,332 B2
(45) Date of Patent: Apr. 10, 2018

(54) SEMICONDUCTOR MEMORY DEVICE AND STRUCTURE

(71) Applicant: Monolithic 3D Inc., San Jose, CA (US)

(72) Inventors: Zvi Or-Bach, San Jose, CA (US); Deepak C. Sekar, San Jose, CA (US); Brian Cronquist, San Jose, CA (US); Israel Beinglass, Sunnyvale, CA (US); Zeev Wurman, Palo Alto, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

(21) Appl. No.: 15/409,740

(22) Filed: Jan. 19, 2017

(65) Prior Publication Data

US 2017/0133432 A1 May 11, 2017

Related U.S. Application Data

(63) Continuation-in-part of application No. 15/224,929, filed on Aug. 1, 2016, which is a continuation-in-part
(Continued)

(51) Int. Cl.
| | |
|---|---|
| *H01L 27/10* | (2006.01) |
| *G11C 13/00* | (2006.01) |
| *H01L 27/24* | (2006.01) |
| *H01L 45/00* | (2006.01) |
| *H01L 29/04* | (2006.01) |

(Continued)

(52) U.S. Cl.
CPC ...... *H01L 27/2436* (2013.01); *G11C 13/0021* (2013.01); *H01L 27/1052* (2013.01); *H01L 27/249* (2013.01); *H01L 29/04* (2013.01); *H01L 29/167* (2013.01); *H01L 29/66568* (2013.01); *H01L 29/78* (2013.01); *H01L 45/146* (2013.01); *H01L 45/1616* (2013.01); *H01L 21/0262* (2013.01); *H01L 21/02532* (2013.01); *H01L 21/02667* (2013.01); *H01L 21/2236* (2013.01); *H01L 21/31116* (2013.01); *H01L 21/324* (2013.01)

(58) Field of Classification Search
CPC ............ H01L 27/1052; G11C 13/0021; G11C 2213/71; G11C 2213/79
See application file for complete search history.

(56) References Cited

U.S. PATENT DOCUMENTS

| | | | | |
|---|---|---|---|---|
| 6,483,736 | B2 * | 11/2002 | Johnson | ............... G11C 11/5692 257/E27.073 |
| 8,008,732 | B2 * | 8/2011 | Kiyotoshi | ............. H01L 27/105 257/324 |

(Continued)

OTHER PUBLICATIONS

Colinge, "Junctionless Transistors", Jan. 2012, IEEE, 2 pages.*

*Primary Examiner* — Evan Pert
(74) *Attorney, Agent, or Firm* — Tran & Associates

(57) ABSTRACT

A semiconductor memory, including: a first memory cell including a first transistor; a second memory cell including a second transistor; and a memory peripherals transistor overlaying the second transistor or underneath the first transistor, where the second memory cell overlays the first memory cell, and where the first memory cell and the second memory cell have both been processed following a lithography step and accordingly are precisely aligned, and where the memory peripherals transistor is part of a peripherals circuit controlling the memory.

20 Claims, 40 Drawing Sheets

Related U.S. Application Data of application No. 14/514,386, filed on Oct. 15, 2014, now Pat. No. 9,406,670, which is a continuation of application No. 13/492,382, filed on Jun. 8, 2012, now Pat. No. 8,907,442, which is a continuation of application No. 13/246,384, filed on Sep. 27, 2011, now Pat. No. 8,237,228, which is a continuation of application No. 12/900,379, filed on Oct. 7, 2010, now Pat. No. 8,395,191, which is a continuation-in-part of application No. 12/859,665, filed on Aug. 19, 2010, now Pat. No. 8,405,420, which is a continuation-in-part of application No. 12/849,272, filed on Aug. 3, 2010, now Pat. No. 7,986,042, and a continuation-in-part of application No. 12/847,911, filed on Jul. 30, 2010, now Pat. No. 7,960,242, which is a continuation-in-part of application No. 12/792,673, filed on Jun. 2, 2010, now Pat. No. 7,964,916, and a continuation-in-part of application No. 12/797,493, filed on Jun. 9, 2010, now Pat. No. 8,115,511, and a continuation-in-part of application No. 12/706,520, filed on Feb. 16, 2010, now abandoned, and application No. 12/792,673, which is a continuation-in-part of application No. 12/577,532, filed on Oct. 12, 2009, now abandoned, and application No. 12/797,493, which is a continuation-in-part of application No. 12/577,532, filed on Oct. 12, 2009, now abandoned.

(51) Int. Cl.

| | | |
|---|---|---|
| *H01L 29/167* | (2006.01) | |
| *H01L 29/78* | (2006.01) | |
| *H01L 29/66* | (2006.01) | |
| *H01L 27/105* | (2006.01) | |
| *H01L 21/02* | (2006.01) | |
| *H01L 21/324* | (2006.01) | |
| *H01L 21/223* | (2006.01) | |
| *H01L 21/311* | (2006.01) | |

(56) References Cited

U.S. PATENT DOCUMENTS

| | | | |
|---|---|---|---|
| 9,595,530 B1 * | 3/2017 | Zhou | H01L 27/2454 |
| 9,673,257 B1 * | 6/2017 | Takaki | H01L 27/249 |
| 2007/0206408 A1 * | 9/2007 | Schwerin | G11C 11/5678 365/163 |
| 2009/0185407 A1 * | 7/2009 | Park | G11C 5/025 365/51 |
| 2009/0302294 A1 * | 12/2009 | Kim | G11C 13/0004 257/2 |
| 2010/0219392 A1 * | 9/2010 | Awaya | H01L 27/0688 257/3 |
| 2011/0222356 A1 * | 9/2011 | Banna | H01L 27/105 365/189.011 |
| 2012/0126197 A1 * | 5/2012 | Chung | H01L 21/823871 257/9 |
| 2013/0203248 A1 * | 8/2013 | Ernst | H01L 21/8221 438/530 |
| 2014/0151774 A1 * | 6/2014 | Rhie | H01L 27/11573 257/314 |
| 2015/0243887 A1 * | 8/2015 | Saitoh | H01L 45/1253 257/4 |
| 2016/0141334 A1 * | 5/2016 | Takaki | H01L 27/249 257/5 |

\* cited by examiner

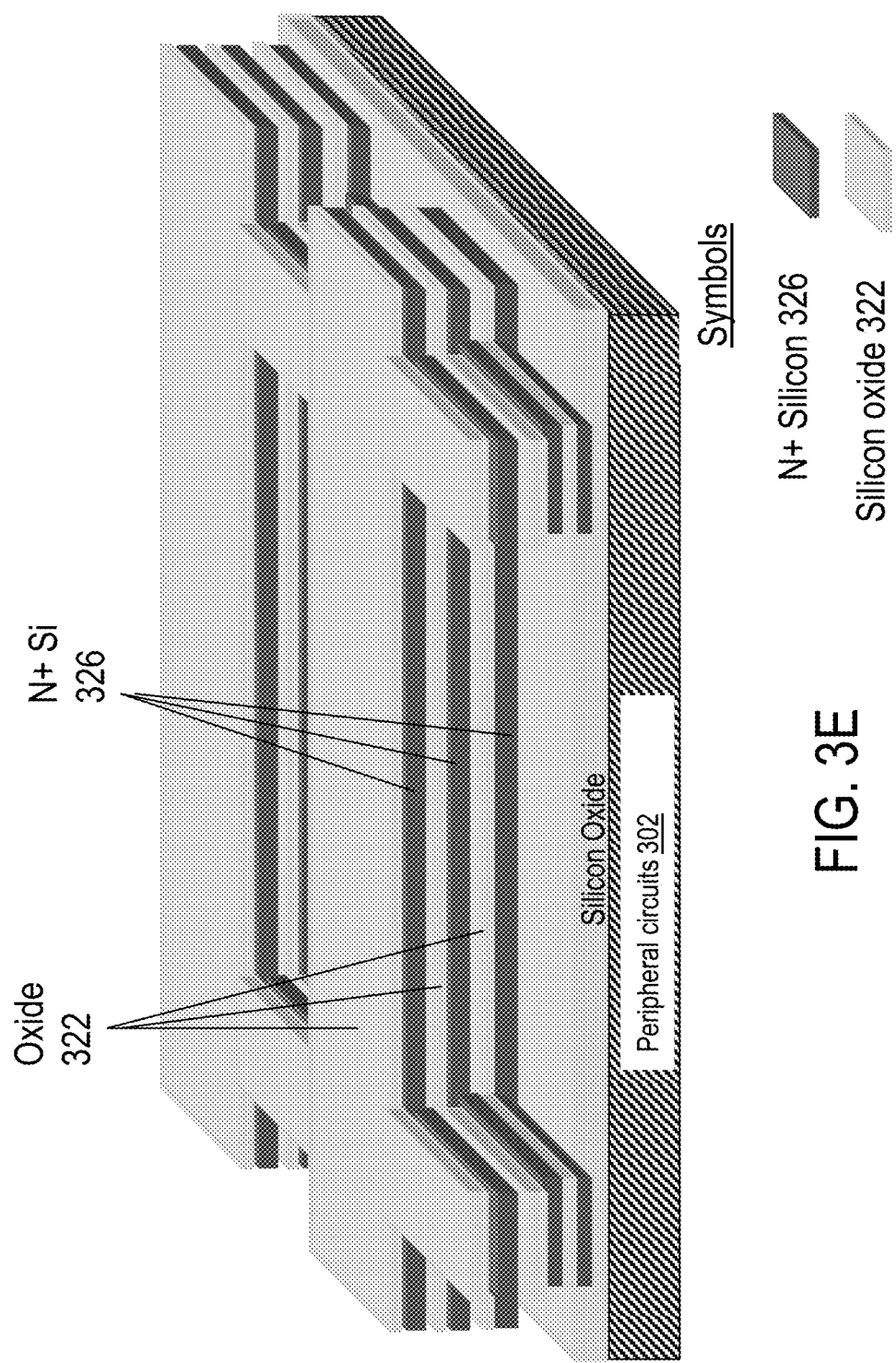

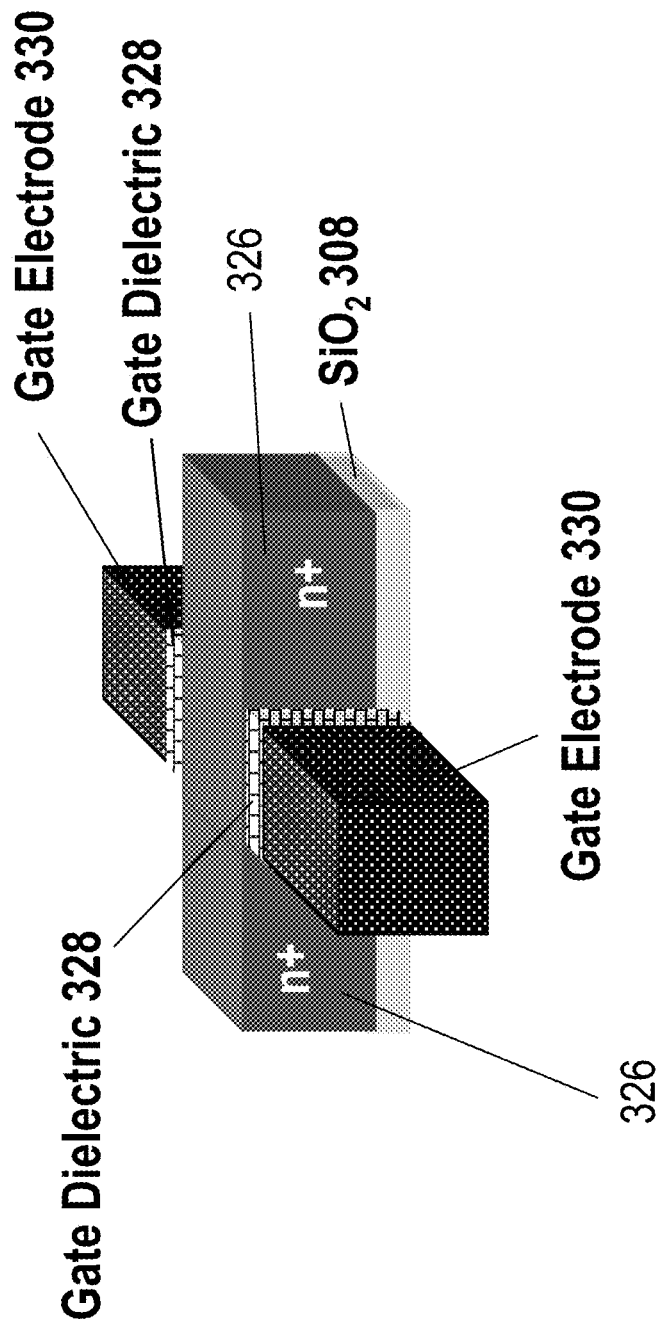

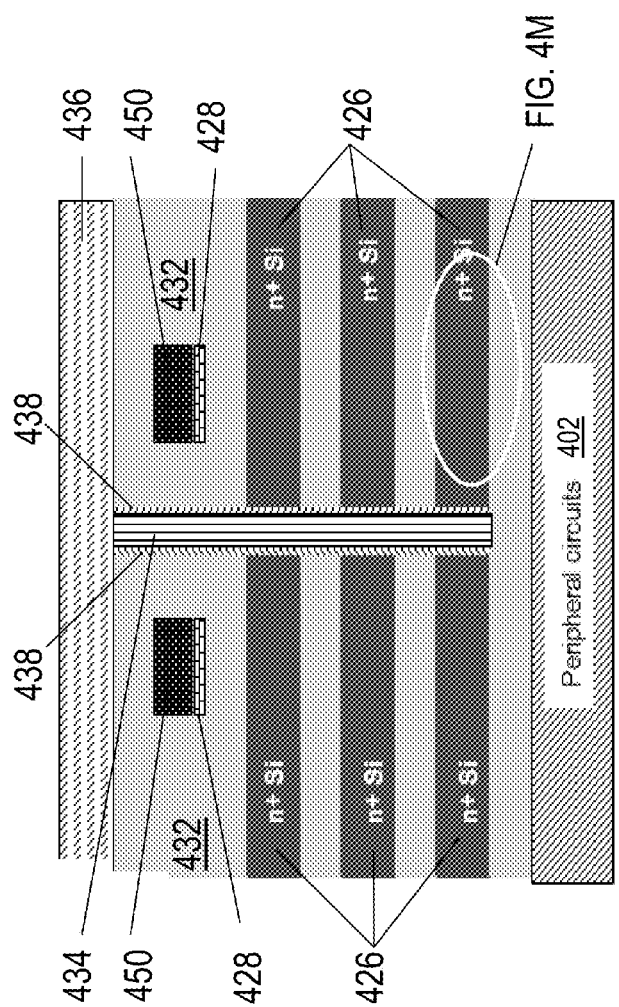

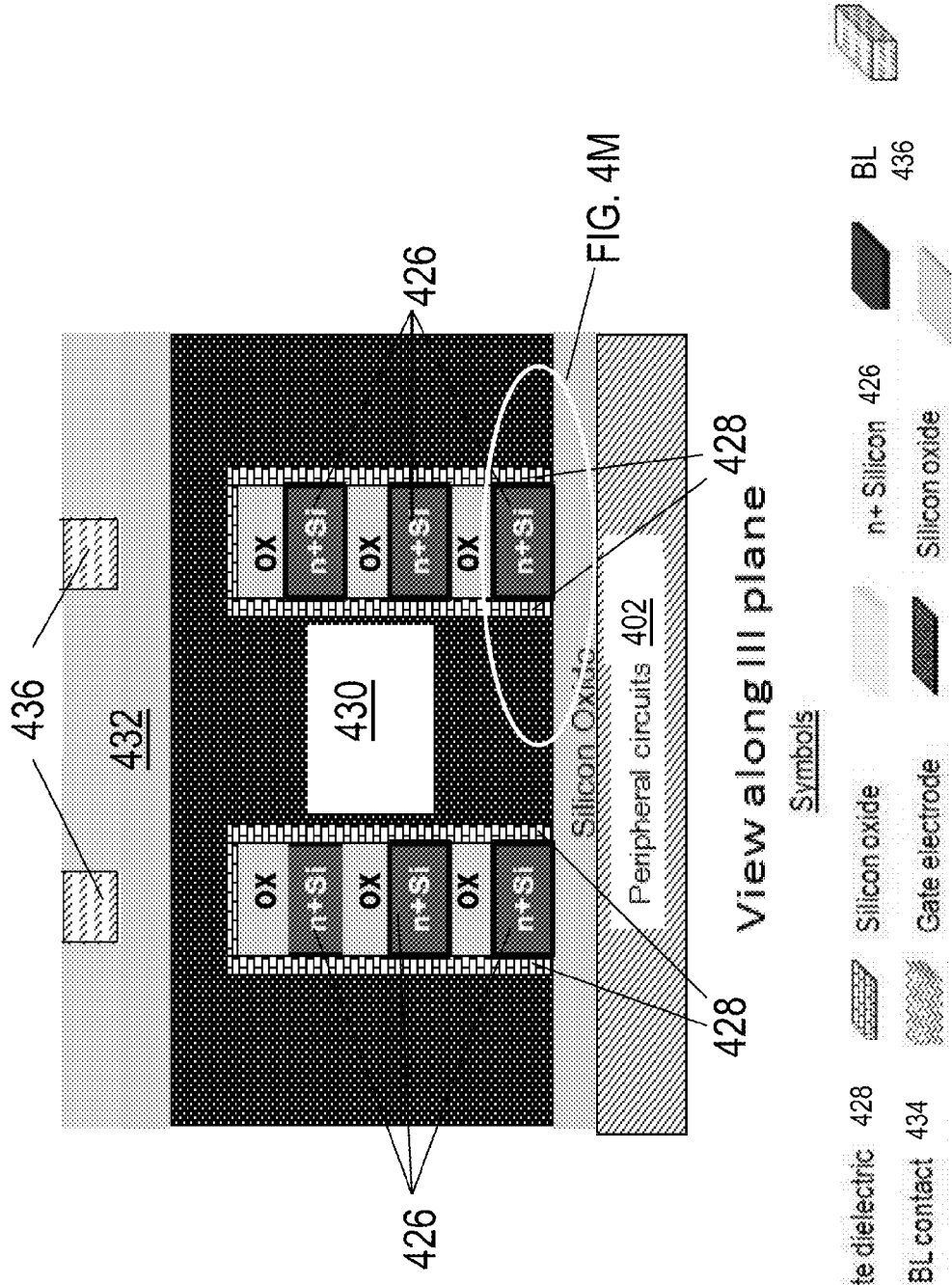

SEMICONDUCTOR MEMORY DEVICE AND STRUCTURE

CROSS-REFERENCE OF RELATED APPLICATIONS

This application is a continuation-in-part of co-pending U.S. patent application Ser. No. 15/224,929 filed Aug. 1, 2016, which is a continuation-in-part of U.S. patent application Ser. No. 14/514,386 filed Oct. 15, 2014 (now issued as U.S. Pat. No. 9,406,670 on Aug. 2, 2016), which is a continuation of U.S. patent application Ser. No. 13/492,382 filed Jun. 8, 2012 (now issued as U.S. Pat. No. 8,907,442 on Dec. 9, 2014), which is a continuation of U.S. patent application Ser. No. 13/246,384 filed Sep. 27, 2011 (now issued as U.S. Pat. No. 8,237,228 on Aug. 7, 2012), which is a continuation U.S. patent application Ser. No. 12/900,379 filed Oct. 7, 2010 (now issued as U.S. Pat. No. 8,395,191 on Mar. 12, 2013), which is a continuation-in-part of U.S. patent application Ser. No. 12/859,665 filed Aug. 19, 2010 (now issued as U.S. Pat. No. 8,405,420 on Mar. 26, 2013), which is a continuation-in-part of U.S. patent application Ser. No. 12/849,272 filed Aug. 3, 2010 (now issued as U.S. Pat. No. 7,986,042 on Jul. 26, 2011) and U.S. patent application Ser. No. 12/847,911 filed Jul. 30, 2010 (now issued as U.S. Pat. No. 7,960,242 on Jun. 14, 2011); U.S. patent application Ser. No. 12/847,911 is a continuation-in-part of U.S. patent application Ser. No. 12/792,673 filed Jun. 2, 2010 (now issued as U.S. Pat. No. 7,964,916 on Jun. 21, 2011), U.S. patent application Ser. No. 12/797,493 filed Jun. 9, 2010 (now issued as U.S. Pat. No. 8,115,511 on Feb. 14, 2012), and U.S. patent application Ser. No. 12/706,520 filed Feb. 16, 2010; both U.S. patent application Ser. No. 12/792,673 and U.S. patent application Ser. No. 12/797,493 are continuation-in-part applications of U.S. patent application Ser. No. 12/577,532 filed Oct. 12, 2009, the entire contents of all of the foregoing are incorporated by reference. The entire contents of U.S. application Ser. No. 13/273,712, which was filed on Oct. 14, 2011, and is now U.S. Pat. No. 8,273,610, is incorporated by reference.

BACKGROUND OF THE INVENTION

1. Field of the Invention

The present invention relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1M for today's state of the art device mask set.

These changes represent an increasing challenge primarily to custom products, which tend to target smaller volume and less diverse markets therefore making the increased cost of product development very hard to accommodate.

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,836,073, 8,902,663, 8,994,404, 9,021,414, 9,023,688, 9,030,858, 9,117,749, 9,142,553, 9,219,005, 9,385,088, 9,406,670, 9,460,978, 9,509,313; U.S. patent publications 2011/0092030, 2016/0218046; and pending U.S. patent applications Ser. Nos. 62/077,280, 62/042,229, 61/932,617, 14/607,077, 14/642,724, 62/139,636, 62/149,651, 62/198,126, 62/239,931, 62/246,054, 62/307,568, 62/297,857, 15/095,187, 15/150,395, 15/173,686, 62/383,463, 62/440,720, 62/443,751, 15/243,941, PCT/US16/52726, 62/406,376, 62/432,575, 62/440,720, 62/297,857, 15/333,138, 15/344,562, and 15/351,389. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753,913, 8,823,122, 9,197,804, 9,419,031; and U.S. patent publication 2016/0064439. The entire contents of the foregoing patents, publications, and applications are incorporated herein by reference.

In landmark papers at VLSI 2007 and IEDM 2007, Toshiba presented techniques to construct 3D memories which they called—BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In at least our U.S. Pat. Nos. 8,026,521, 8,114,757, 8,687,399, 8,379,458, and 8,902,663, incorporated herein by reference, we presented multiple 3D memory structures generally constructed by successive layer transfers using ion cut techniques. In this work we are presenting methods and structures to construct 3D memory with monocrystalline channels constructed by successive layer transfers. This structure provides the benefit of multiple layers being processed by one lithography step with many of the benefits of a monocrystalline channel, and provides overall lower construction costs.

Additionally some embodiments of the invention may provide innovative alternatives for multi layer 3D IC technology. As on-chip interconnects are becoming the limiting factor for performance and power enhancement with device scaling, 3D IC may be an important technology for future generations of ICs. Currently the only viable technology for 3D IC is to finish the IC by the use of Through-Silicon-Via (TSV). The problem with TSVs is that they are relatively large (a few microns each in area) and therefore may lead to highly limited vertical connectivity. The current invention may provide multiple alternatives for 3D IC with at least an order of magnitude improvement in vertical connectivity.

Constructing future 3D ICs will require new architectures and new ways of thinking. In particular, yield and reliability of extremely complex three dimensional systems will have to be addressed, particularly given the yield and reliability difficulties encountered in building complex Application Specific Integrated Circuits (ASIC) of recent deep submicron process generations.

Additionally the 3D technology according to some embodiments of the current invention may enable some very innovative IC alternatives with reduced development costs, increased yield, and other important benefits.

SUMMARY

The invention relates to multilayer or Three Dimensional Integrated Circuit (3D IC) devices and fabrication methods.

In one aspect, a semiconductor memory, comprising: a first memory cell comprising a first transistor; a second memory cell comprising a second transistor; and a memory peripherals transistor overlaying said second transistor or underneath said first transistor, wherein said second memory cell overlays said first memory cell, and wherein said first memory cell and said second memory cell have both been processed following a lithography step and accordingly are precisely aligned, and wherein said memory peripherals transistor is part of a peripherals circuit controlling said memory.

In another aspect, a semiconductor memory, comprising: a first memory cell comprising a first transistor; a second memory cell comprising a second transistor; and a memory peripherals transistor overlaying said second transistor or underneath said first transistor, wherein said second memory cell overlays said first memory cell, and wherein said first memory cell and said second memory cell have both been processed following a lithography step and accordingly are precisely aligned, and wherein said first transistor and said memory peripherals transistor have a misalignment to each other of less than 40 nm.

In another aspect, a semiconductor memory, comprising: a first memory cell comprising a first transistor; a second memory cell comprising a second transistor; and a memory peripherals transistor overlaying said second transistor or underneath said first transistor, wherein said second memory cell overlays said first memory cell, and wherein said first memory cell and said second memory cell have both been processed following a lithography step and accordingly are precisely aligned, and wherein said memory peripherals transistor comprises a single crystal channel and is part of a peripherals circuit controlling said memory.

Additionally there is a growing need to reduce the impact of inter-chip interconnects. In fact, interconnects are now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs is that their large size, usually a few microns each, may severely limit the number of connections that can be made. Some embodiments of the current invention may provide multiple alternatives to constructing a 3D IC wherein many connections may be made less than one micron in size, thus enabling the use of 3D IC technology for most device applications.

Additionally some embodiments of this invention may offer new device alternatives by utilizing the proposed 3D IC technology.

BRIEF DESCRIPTION OF THE DRAWINGS

Various embodiments of the present invention will be understood and appreciated more fully from the following detailed description, taken in conjunction with the drawings in which:

FIGS. 3A-3M are drawing illustrations of the formation of a resistive memory transistor;

FIGS. 4A-4M are drawing illustrations of the formation of a resistive memory transistor;

DETAILED DESCRIPTION

Figure 1:
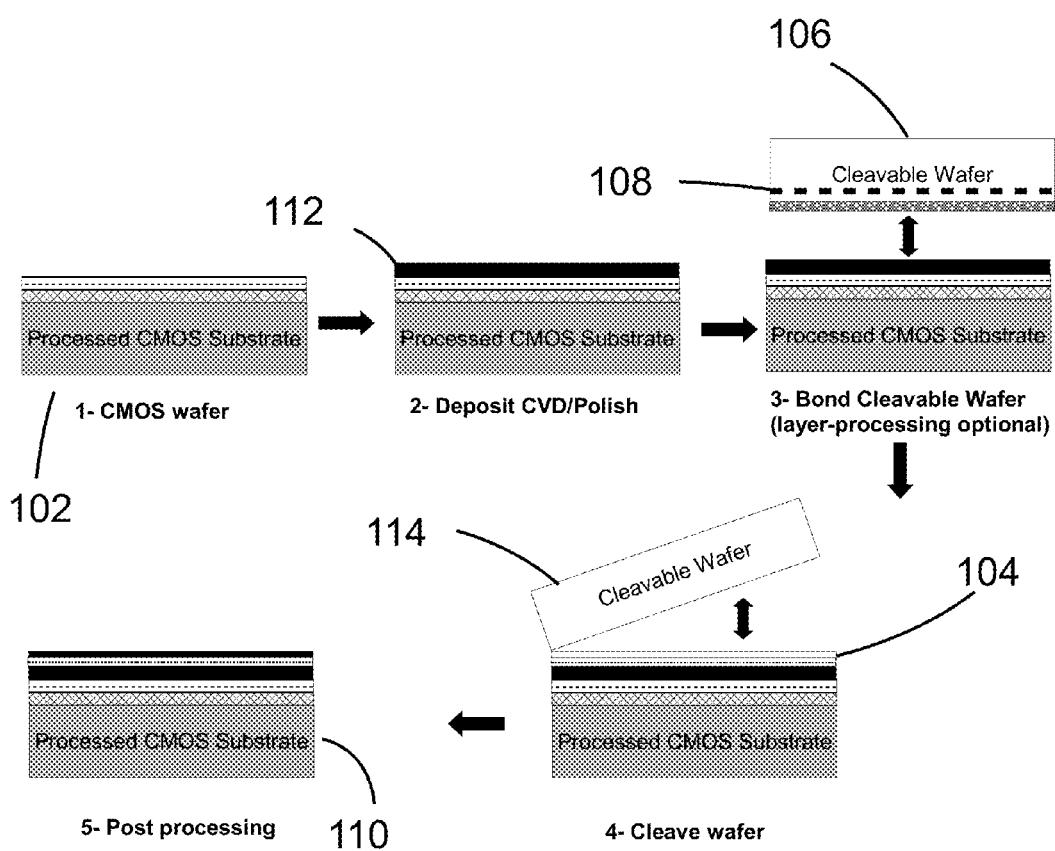
FIG. 1 is a drawing illustration of a layer transfer process flow.

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for fabricating devices. The process flows, which may be a sequence of steps for fabricating a device, may have many structures, numerals and labels that may be common between two or more successive steps. In such cases, some labels, numerals and structures used for a certain step's figure may have been described in the previous steps' figures.

A technology for creating layer stacks or overlying or underlying circuitry is to use the "SmartCut" process. The "SmartCut" process is a well understood technology used for fabrication of SOI wafers. The "SmartCut" process, together with wafer bonding technology, enables a "Layer Transfer" whereby a thin layer of a single or mono-crystalline silicon wafer is transferred from one wafer to another wafer. The "Layer Transfer" could be done at less than 400° C. and the resultant transferred layer could be even less than 100 nm thick. The process with some variations and under different names is commercially available by two companies, namely, Soitec (Crolles, France) and SiGen—Silicon Genesis Corporation (San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

Alternatively, other technology may be used. For example, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer is subsequently aligned and low-temperature oxide-to-oxide bonded to the acceptor wafer topside. A low temperature release of the glass handle wafer from the thinned donor wafer is performed, and then thru bond via connections are made. Additionally, epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, silicon oxide in SOI or AlAs. After liftoff, the transferred layer is then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010.

Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores are treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

FIG. 1 is a drawing illustration of a layer transfer process flow. In another alternative of the invention, "Layer-Transfer" is used for construction of the underlying circuitry 814. 102 is a wafer that was processed to construct the underlying circuitry. The wafer 102 could be of the most advanced process or more likely a few generations behind. It could comprise the programming circuits 814 and other useful structures and may be a preprocessed CMOS silicon wafer, or a partially processed CMOS, or other prepared silicon or semiconductor substrate. Wafer 102 may also be called an acceptor substrate or a target wafer. An oxide layer 112 is then deposited on top of the wafer 102 and then is polished for better planarization and surface preparation. A donor wafer 106 is then brought in to be bonded to 102. The surfaces of both donor wafer 106 and wafer 102 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 106 is pre-prepared for "SmartCut" by an ion implant of an atomic species, such as H+ ions, at the desired depth to prepare the SmartCut line 108. SmartCut line 108 may also be called a layer transfer demarcation plane, shown as a dashed line. The SmartCut line 108 or layer transfer demarcation plane may be formed before or after other processing on the donor wafer 106. Donor wafer 106 may be bonded to wafer 102 by bringing the donor wafer 106 surface in physical contact with the wafer 102 surface, and then applying mechanical force and/or thermal annealing to strengthen the oxide to oxide bond. Alignment of the donor wafer 106 with the wafer 102 may be performed immediately prior to the wafer bonding. Acceptable bond strengths may be obtained with bonding thermal cycles that do not exceed approximately 400° C. After bonding the two wafers a SmartCut step is performed to cleave and remove the top portion 114 of the donor wafer 106 along the cut layer 108. The cleaving may be accomplished by various applications of energy to the SmartCut line 108, or layer transfer demarcation plane, such as a mechanical strike by a knife or jet of liquid or jet of air, or by local laser heating, or other suitable methods. The result is a 3D wafer 110 which comprises wafer 102 with an added layer 104 of mono-crystalline silicon, or multiple layers of materials. Layer 104 may be polished chemically and mechanically to provide a suitable surface for further processing. Layer 104 could be quite thin at the range of 50-200 nm as desired. The described flow is called "layer transfer". Layer transfer is commonly utilized in the fabrication of SOI—Silicon On Insulator—wafers. For SOI wafers the upper surface is oxidized so that after "layer transfer" a buried oxide—BOX—provides isolation between the top thin mono-crystalline silicon layer and the bulk of the wafer. The use of an implanted atomic species, such as Hydrogen or Helium or a combination, to create a cleaving plane as described above may be referred to in this document as "ion-cut" and is the preferred and illustrated layer transfer method utilized.

Persons of ordinary skill in the art will appreciate that the illustrations in FIG. 1 are exemplary only and are not drawn to scale. Such skilled persons will further appreciate that many variations are possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without a implant cleave process and the donor wafer may be preferentially etched away until the etch stop layer is reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

One alternative method is to have a thin layer transfer of single crystal silicon which will be used for epitaxial Ge crystal growth using the transferred layer as the seed for the germanium. Another alternative method is to use the thin layer transfer of mono-crystalline silicon for epitaxial growth of GexSi1-x. The percent Ge in Silicon of such layer would be determined by the transistor specifications of the circuitry. Prior art have presented approaches whereby the base silicon is used to crystallize the germanium on top of the oxide by using holes in the oxide to drive crystal or lattice seeding from the underlying silicon crystal. However, it is very hard to do such on top of multiple interconnection layers. By using layer transfer we can have a mono-crystalline layer of silicon crystal on top and make it relatively easy to seed and crystallize an overlying germanium layer. Amorphous germanium could be conformally deposited by CVD at 300° C. and pattern aligned to the underlying layer, such as a pre-processed wafer or layer, and then encapsulated by a low temperature oxide. A short microsecond-duration heat pulse melts the Ge layer while keeping the underlying structure below 400° C. The Ge/Si interface will start the crystal or lattice epitaxial growth to crystallize the germanium or GexSi1-x layer. Then implants are made to form Ge transistors and activated by laser pulses without damaging the underlying structure taking advantage of the low activation temperature of dopants in germanium.

Another class of devices that may be constructed partly at high temperature before layer transfer to a substrate with metal interconnects and then completed at low temperature after layer transfer is a junction-less transistor (JLT). For example, in deep sub micron processes copper metallization is utilized, so a high temperature would be above approximately 400° C., whereby a low temperature would be approximately 400° C. and below. The junction-less transistor structure avoids the sharply graded junctions needed as silicon technology scales, and provides the ability to have a thicker gate oxide for an equivalent performance when compared to a traditional MOSFET transistor. The junction-less transistor is also known as a nanowire transistor without junctions, or gated resistor, or nanowire transistor as described in a paper by Jean-Pierre Colinge, et. al., published in Nature Nanotechnology on Feb. 21, 2010. The junction-less transistors may be constructed whereby the transistor channel is a thin solid piece of evenly and heavily doped single crystal silicon. The doping concentration of the channel may be identical to that of the source and drain. The considerations may include the nanowire channel must be thin and narrow enough to allow for full depletion of the carriers when the device is turned off, and the channel doping must be high enough to allow a reasonable current to flow when the device is on. These considerations may lead to tight process variation boundaries for channel thickness, width, and doping for a reasonably obtainable gate work function and gate oxide thickness.

Figures 2A, 2B:
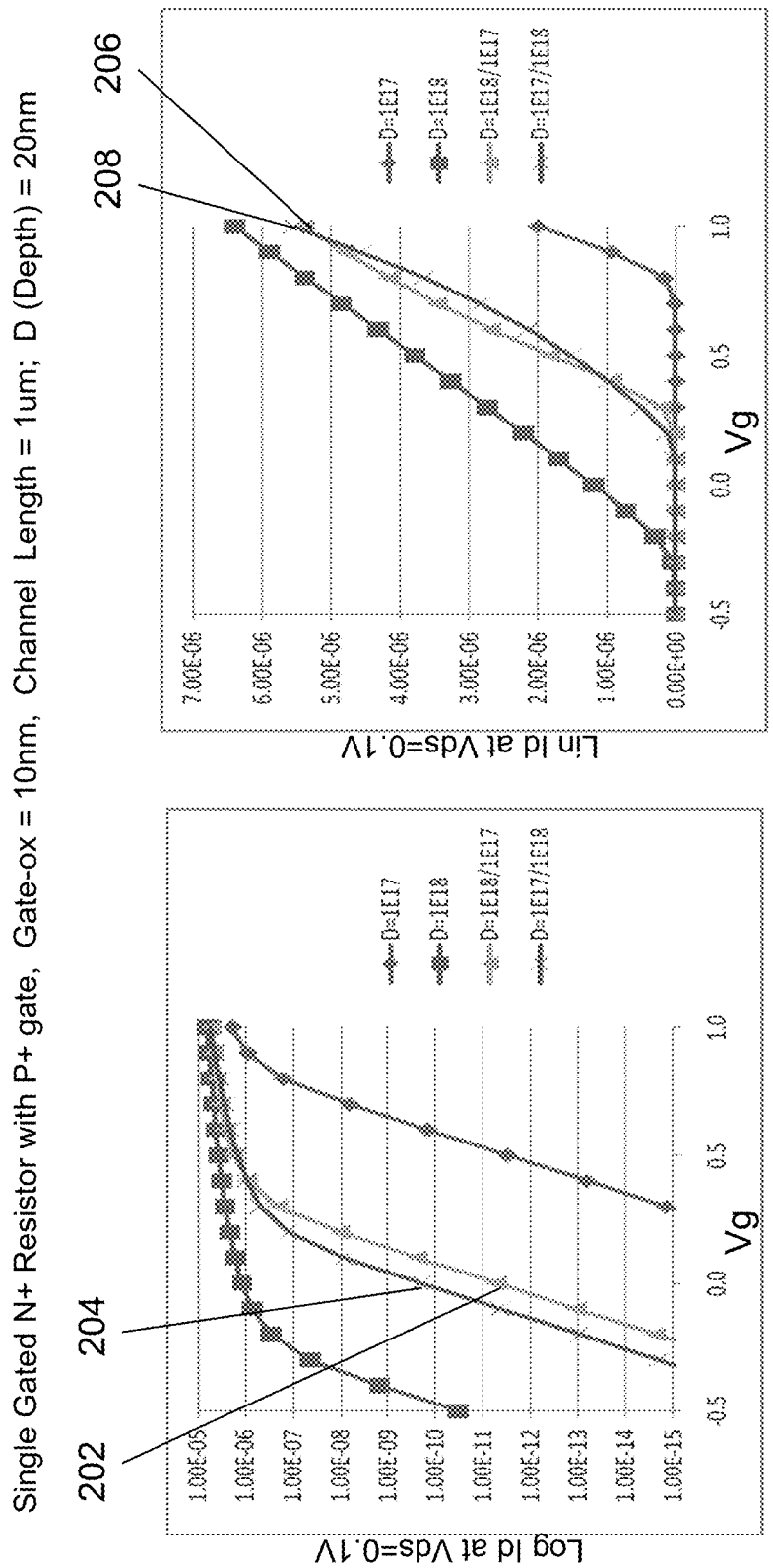
FIGS. 2A, 2B are device simulations of a junction-less transistor.

One of the challenges of a junction-less transistor device is turning the channel off with minimal leakage at a zero gate bias. To enhance gate control over the transistor channel, the channel may be doped unevenly; whereby the heaviest doping is closest to the gate or gates and the channel doping is lighter the farther away from the gate electrode. One example would be where the center of a 2, 3, or 4 gate sided junction-less transistor channel is more lightly doped than the edges. This may enable much lower off currents for the same gate work function and control. FIGS. 52A and 52B show, on logarithmic and linear scales respectively, simulated drain to source current Ids as a function of the gate voltage Vg for various junction-less transistor channel dopings where the total thickness of the n-channel is 20 nm. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 shows the simulated results where the 10 nm channel portion doped at 1E18 is closest to the gate electrode while the 10 nm channel portion doped at 1E17 is farthest away from the gate electrode. In FIG. 2A, curves 202 and 204 correspond to doping patterns of D=1E18/1E17 and D=1E17/1E18, respectively. According to FIG. 52A, at a Vg of 0 volts, the off current for the doping pattern of D=1E18/1E17 is approximately 50 times lower than that of the reversed doping pattern of D=1E17/1E18. Likewise, in FIG. 52B, curves 206 and 208 correspond to doping patterns of D=1E18/1E17 and D=1E17/1E18, respectively. FIG. 52B shows that at a Vg of 1 volt, the Ids of both doping patterns are within a few percent of each other.

The junction-less transistor channel may be constructed with even, graded, or discrete layers of doping. The channel may be constructed with materials other than doped mono-crystalline silicon, such as poly-crystalline silicon, or other semi-conducting, insulating, or conducting material, such as graphene or other graphitic material, and may be in combination with other layers of similar or different material. For example, the center of the channel may comprise a layer of oxide, or of lightly doped silicon, and the edges more heavily doped single crystal silicon. This may enhance the gate control effectiveness for the off state of the resistor, and may also increase the on-current due to strain effects on the other layer or layers in the channel. Strain techniques may also be employed from covering and insulator material above, below, and surrounding the transistor channel and gate. Lattice modifiers may also be employed to strain the silicon, such as an embedded SiGe implantation and anneal. The cross section of the transistor channel may be rectangular, circular, or oval shaped, to enhance the gate control of the channel. Alternatively, to optimize the mobility of the P-channel junction-less transistor in the 3D layer transfer method, the donor wafer may be rotated 90 degrees with respect to the acceptor wafer prior to bonding to facilitate the creation of the P-channel in the <110> silicon plane direction.

Novel monolithic 3D memory technologies utilizing material resistance changes may be constructed in a similar manner. There are many types of resistance-based memories including phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W., et. al. The contents of this document are incorporated in this specification by reference.

As illustrated in FIGS. 3A to 3K, a resistance-based zero additional masking steps per memory layer 3D memory may be constructed that is suitable for 3D IC manufacturing. This 3D memory utilizes junction-less transistors and has a resistance-based memory element in series with a select or access transistor.

Figure 3A:
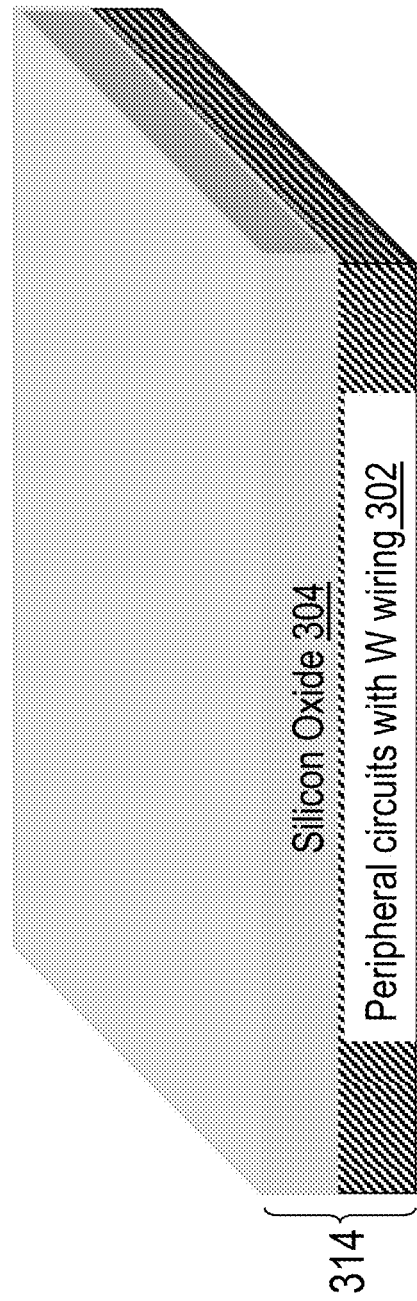

As illustrated in FIG. 3A, a silicon substrate with peripheral circuitry 302 may be constructed with high temperature (greater than approximately 400° C.) resistant wiring, such as, for example, Tungsten. The peripheral circuitry substrate 302 may include memory control circuits as well as circuitry for other purposes and of various types, such as, for example, analog, digital, RF, or memory. The peripheral circuitry substrate 302 may include peripheral circuits that can withstand an additional rapid-thermal-anneal (RTA) and still remain operational and retain good performance. For this purpose, the peripheral circuits may be formed such that they have had a weak RTA or no RTA for activating dopants. The top surface of the peripheral circuitry substrate 302 may be prepared for oxide wafer bonding with a deposition of a silicon oxide 304, thus forming acceptor wafer 314.

Figure 3B:
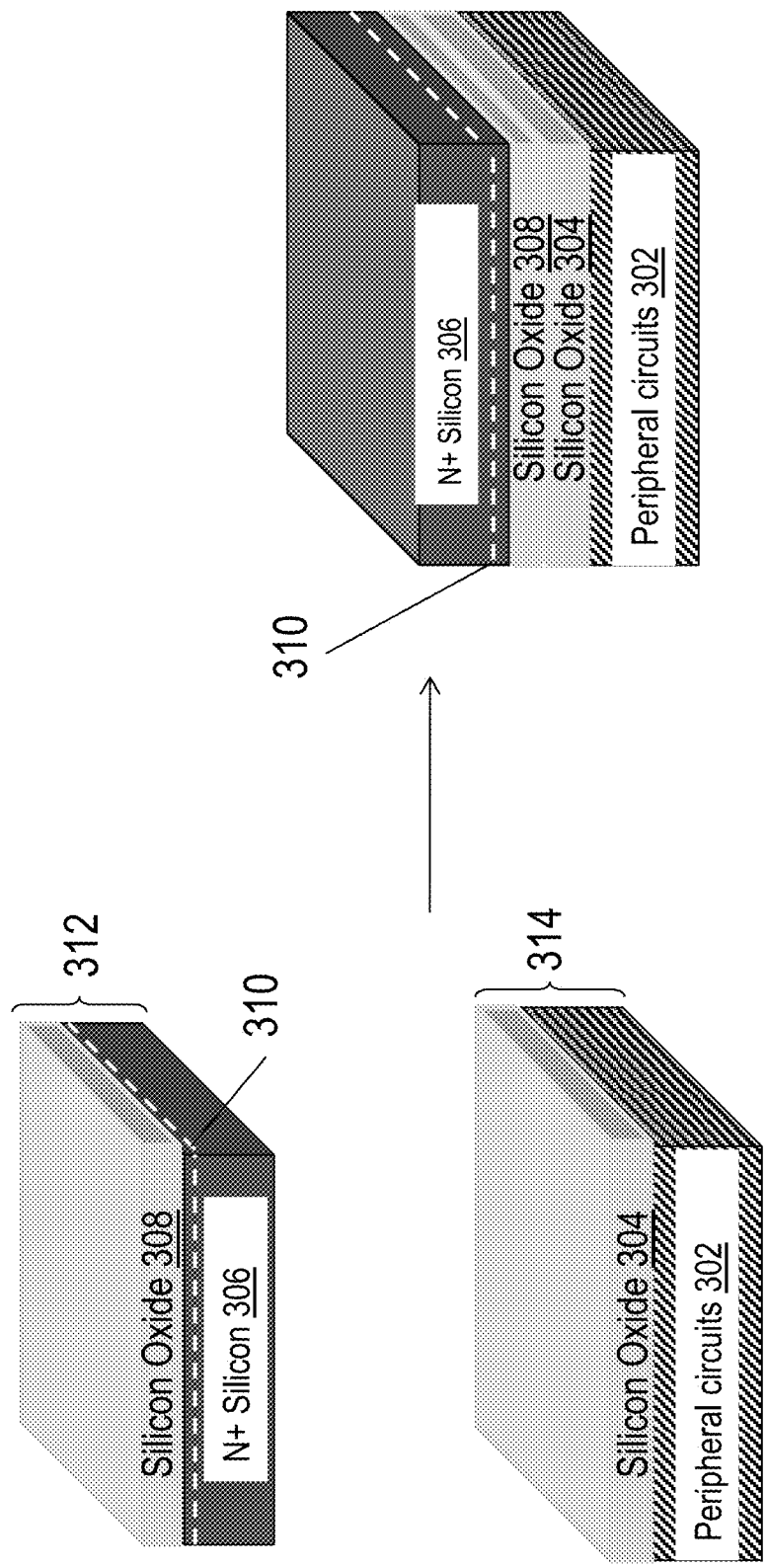

As illustrated in FIG. 3B, a mono-crystalline silicon donor wafer 312 may be optionally processed to include a wafer sized layer of N+ doping (not shown) which may have a different dopant concentration than the N+ substrate 306. The N+ doping layer may be formed by ion implantation and thermal anneal. A screen oxide 308 may be grown or deposited prior to the implant to protect the silicon from implant contamination and to provide an oxide surface for later wafer to wafer bonding. A layer transfer demarcation plane 310 (shown as a dashed line) may be formed in donor wafer 312 within the N+ substrate 306 or the N+ doping layer (not shown) by hydrogen implantation or other methods as previously described. Both the donor wafer 312 and acceptor wafer 314 may be prepared for wafer bonding as previously described and then bonded at the surfaces of oxide layer 304 and oxide layer 308, at a low temperature (less than approximately 400° C.) preferred for lowest stresses, or a moderate temperature (less than approximately 900° C.).

Figure 3C:
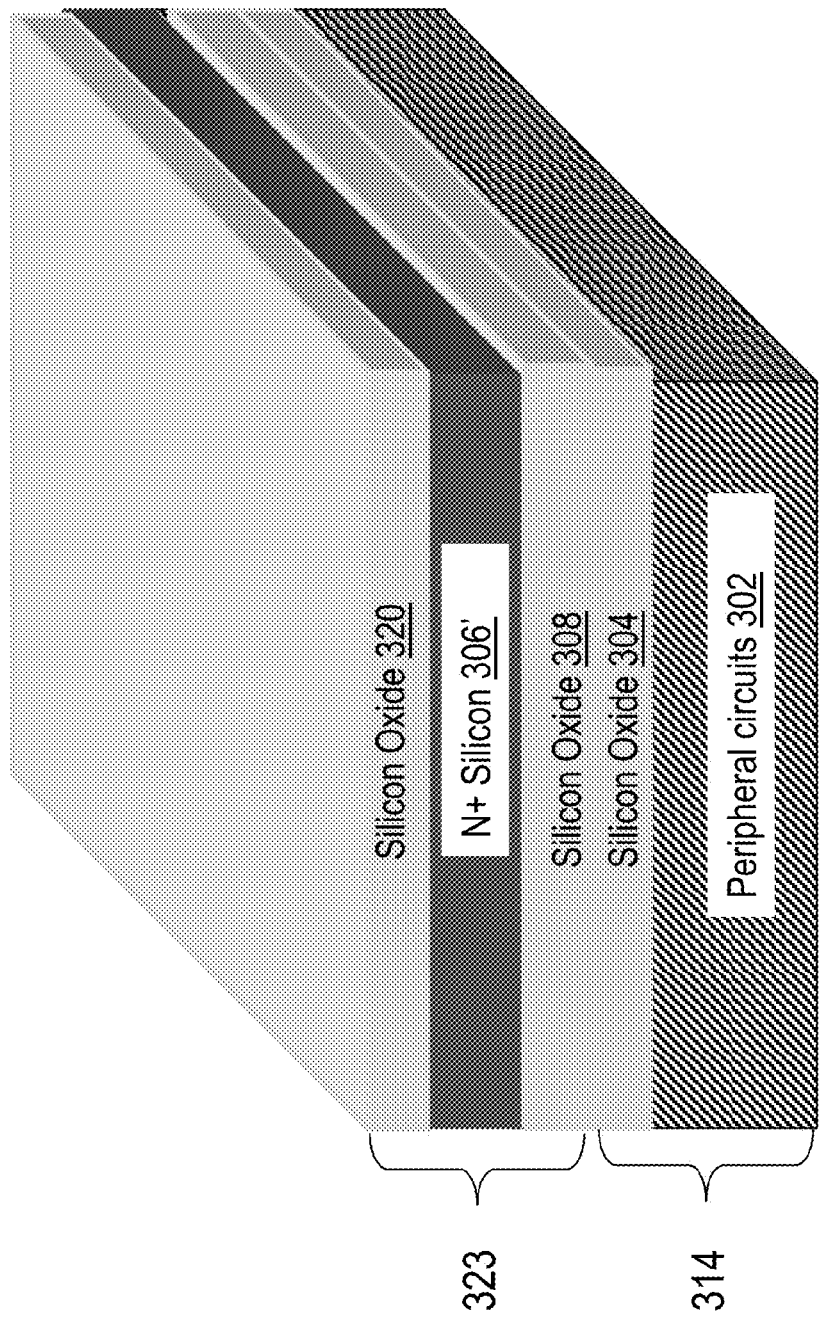

As illustrated in FIG. 3C, the portion of the N+ layer (not shown) and the N+ wafer substrate 306 that are above the layer transfer demarcation plane 310 may be removed by cleaving and polishing, or other processes as previously described, such as, for example, ion-cut or other methods, thus forming the remaining mono-crystalline silicon N+ layer 306'. Remaining N+ layer 306' and oxide layer 308 have been layer transferred to acceptor wafer 314. The top surface of N+ layer 306' may be chemically or mechanically polished smooth and flat. Now transistors or portions of transistors may be formed and aligned to the acceptor wafer 314 alignment marks (not shown). Oxide layer 320 may be deposited to prepare the surface for later oxide to oxide bonding, leading to the formation of the first Si/SiO2 layer 323 that includes silicon oxide layer 320, N+ silicon layer 306', and oxide layer 308.

Figure 3D:
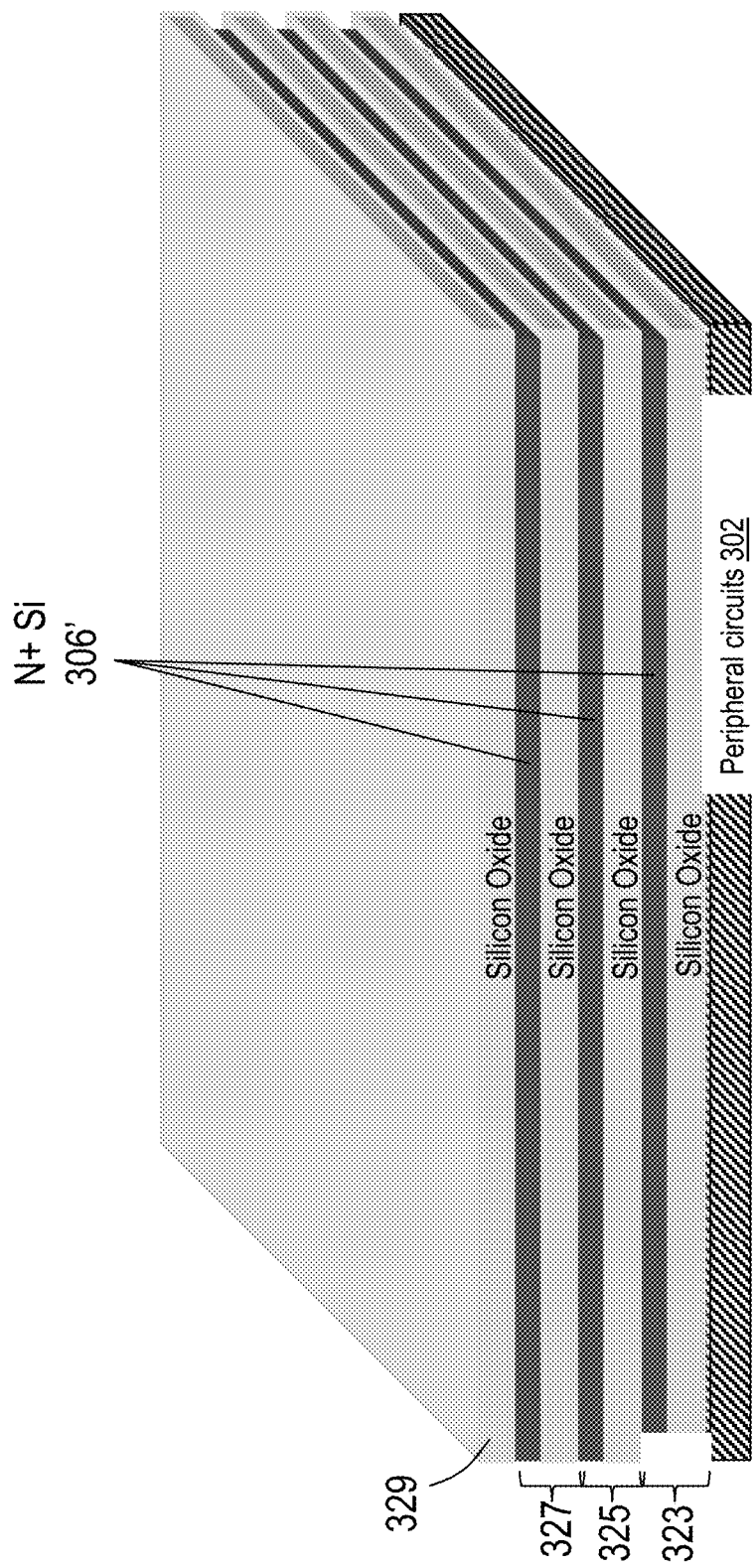

As illustrated in FIG. 3D, additional Si/SiO2 layers, such as, for example, second Si/SiO2 layer 325 and third Si/SiO2 layer 327, may each be formed as described in FIGS. 3A to 3C. Oxide layer 329 may be deposited to electrically isolate the top N+ silicon layer.

As illustrated in FIG. 3E, oxide 329, third Si/SiO2 layer 327, second Si/SiO2 layer 325 and first Si/SiO2 layer 323 may be lithographically defined and plasma/RIE etched to form a portion of the memory cell structure, which now includes regions of N+ silicon 326 and oxide 322.

Figure 3F:
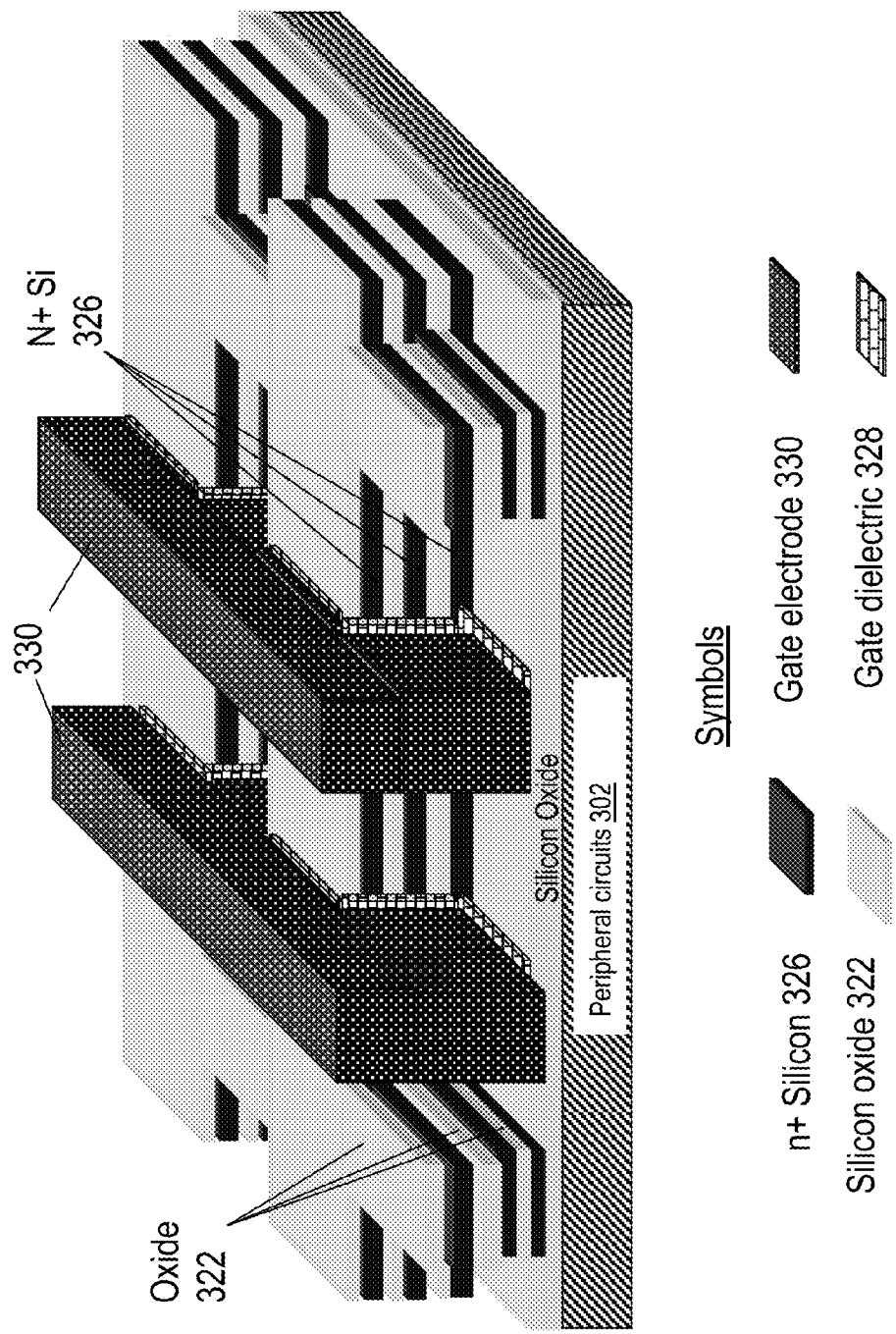

As illustrated in FIG. 3F, a gate dielectric and gate electrode material may be deposited, planarized with a chemical mechanical polish (CMP), and then lithographically defined and plasma/RIE etched to form gate dielectric regions 328 which may either be self aligned to and covered by gate electrodes 330 (shown), or cover the entire N+ silicon 326 and oxide 322 multi-layer structure. The gate stack including gate electrode 330 and gate dielectric 328 may be formed with a gate dielectric, such as, for example, thermal oxide, and a gate electrode material, such as, for example, poly-crystalline silicon. Alternatively, the gate dielectric may be an atomic layer deposited (ALD) material that is paired with a work function specific gate metal according to an industry standard of high k metal gate process schemes described previously. Moreover, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 3G:
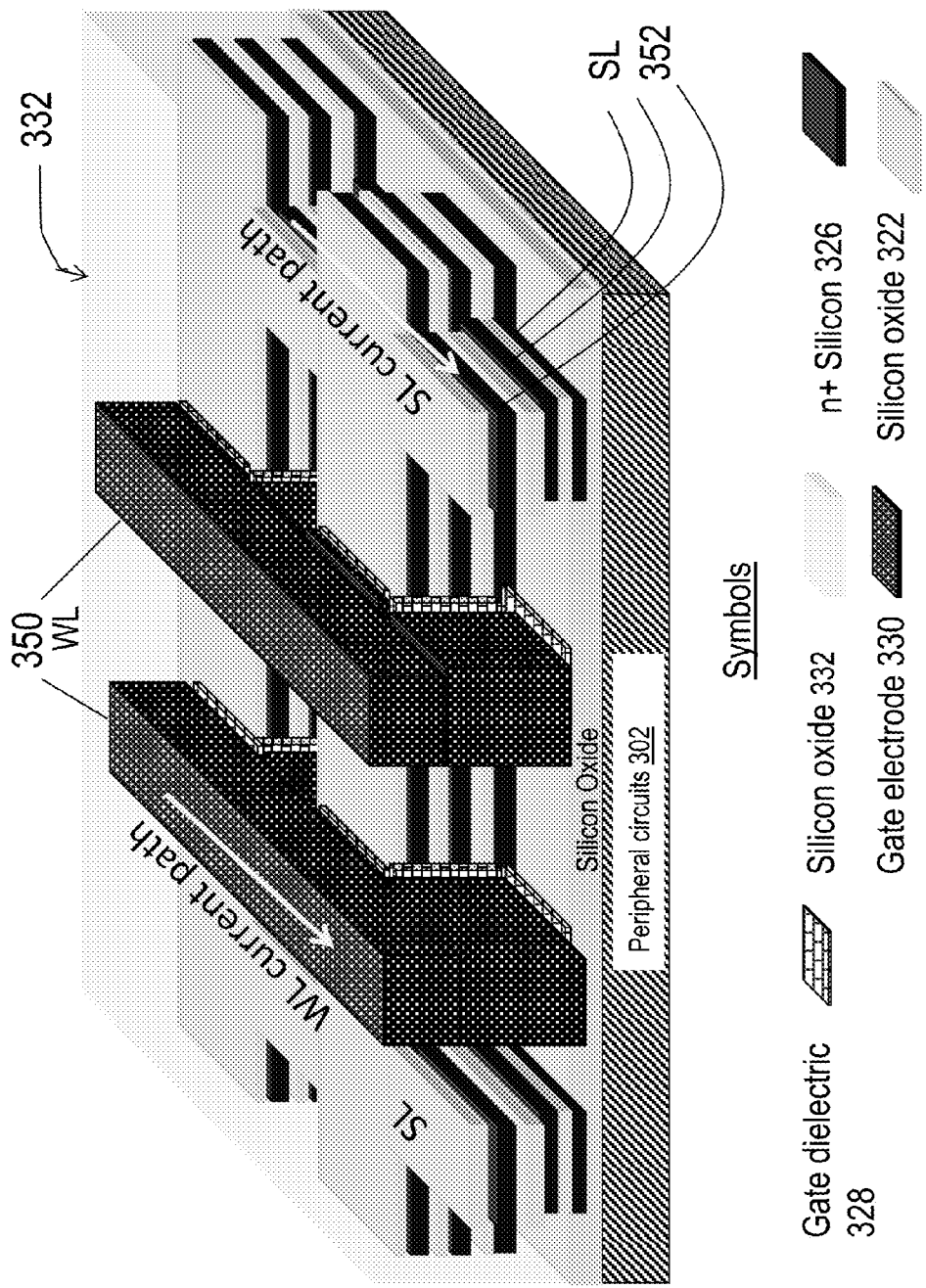

As illustrated in FIG. 3G, the entire structure may be covered with a gap fill oxide 332, which may be planarized with chemical mechanical polishing. The oxide 332 is shown transparent in the figure for clarity, along with word-line regions (WL) 350, coupled with and composed of gate electrodes 330, and source-line regions (SL) 352, composed of N+ silicon regions 326.

Figure 3H:
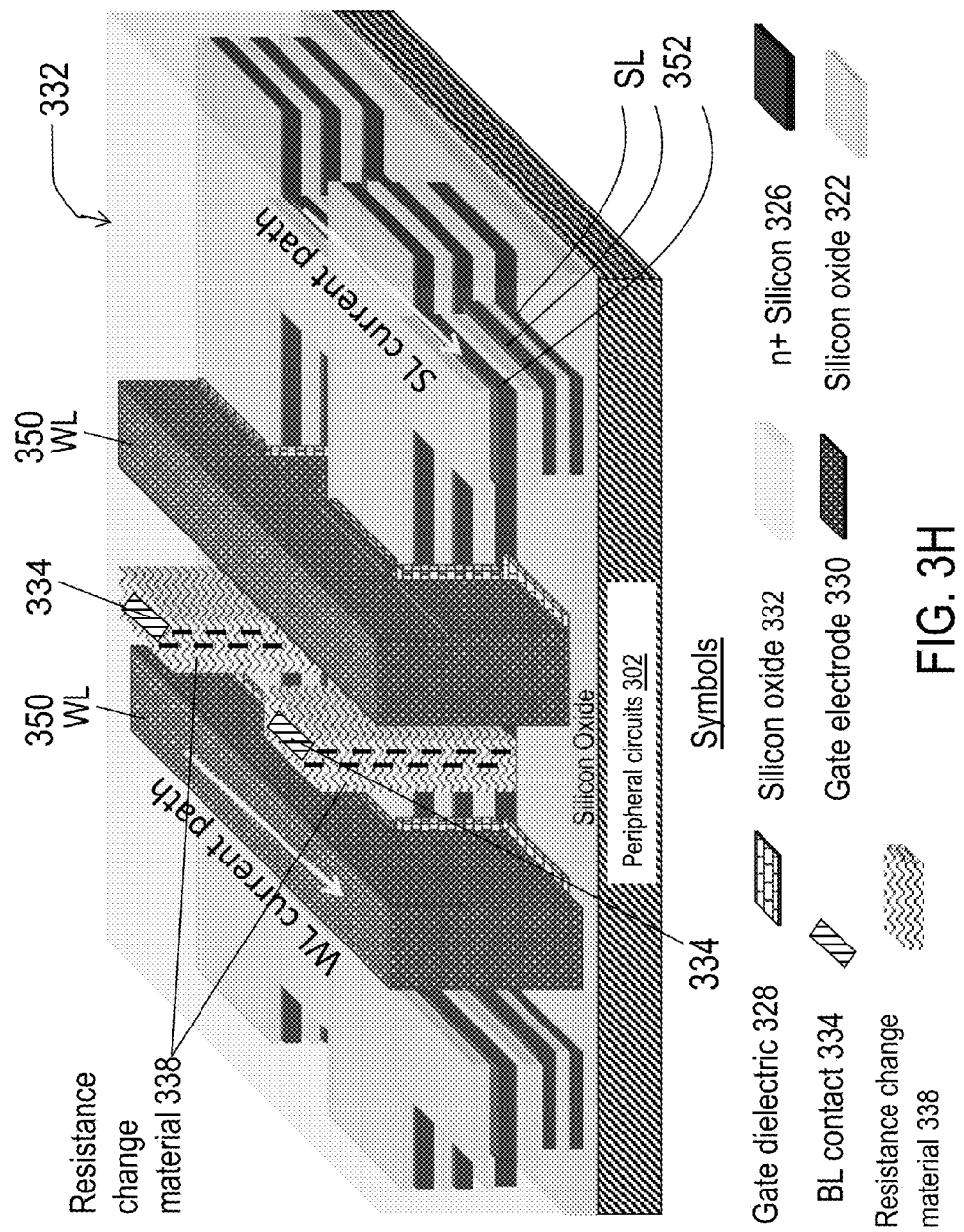

As illustrated in FIG. 3H, bit-line (BL) contacts 334 may be lithographically defined, etched along with plasma/RIE through oxide 332, the three N+ silicon regions 326, and associated oxide vertical isolation regions to connect all memory layers vertically. BL contacts 334 may then be processed by a photoresist removal. Resistance change memory material 338, such as, for example, hafnium oxide, may then be deposited, preferably with atomic layer deposition (ALD). The electrode for the resistance change memory element may then be deposited by ALD to form the electrode/BL contact 334. The excess deposited material may be polished to planarity at or below the top of oxide 332. Each BL contact 334 with resistive change material 338 may be shared among substantially all layers of memory, shown as three layers of memory in FIG. 3H.

Figure 3I:
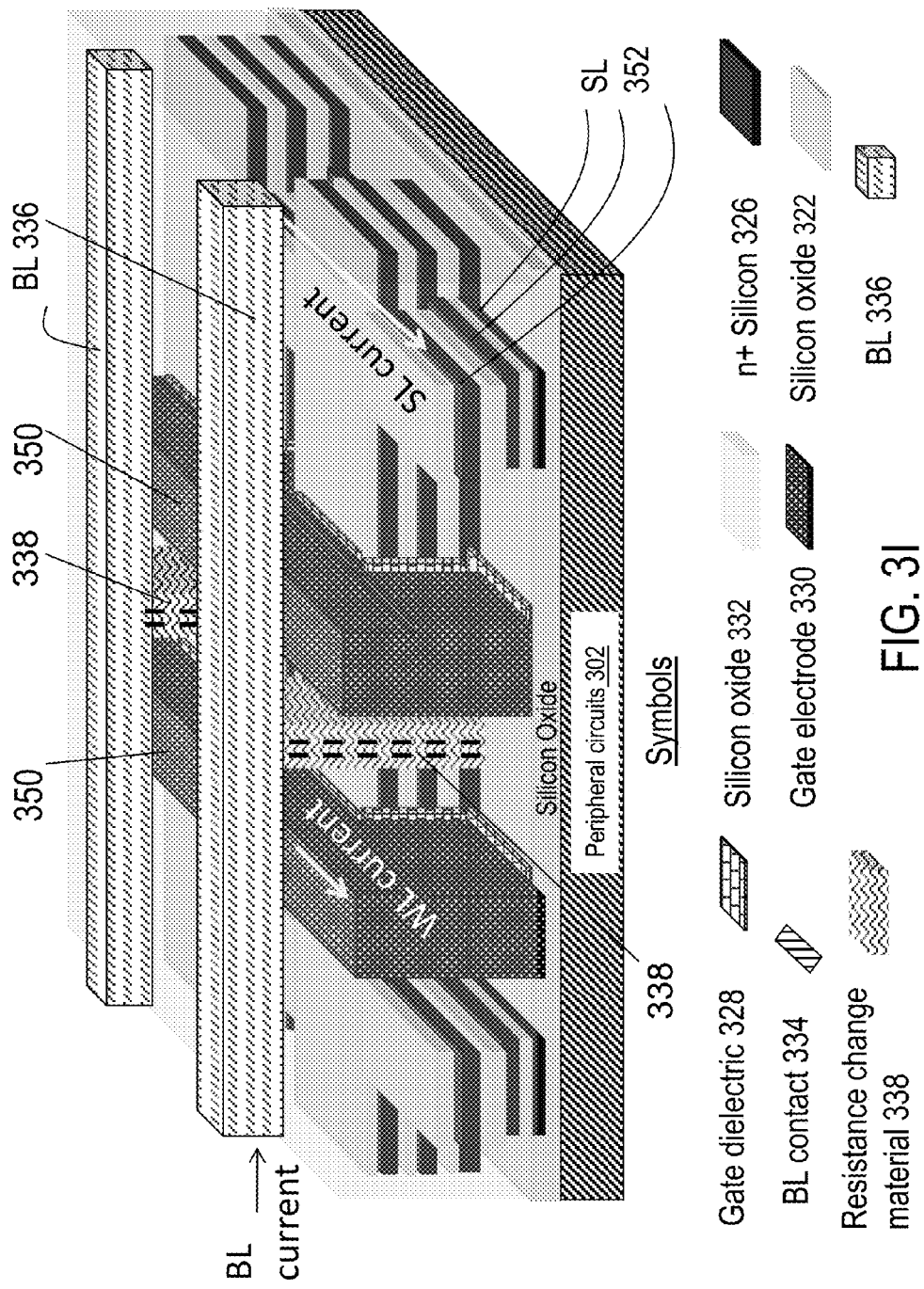

As illustrated in FIG. 3I, BL metal lines 336 may be formed and connect to the associated BL contacts 334 with resistive change material 338. Contacts and associated metal interconnect lines (not shown) may be formed for the WL and SL at the memory array edges. A thru layer via 360 (not shown) may be formed to electrically couple the BL, SL, and WL metallization to the acceptor substrate 314 peripheral circuitry via an acceptor wafer metal connect pad 380 (not shown).

Figure 3J:
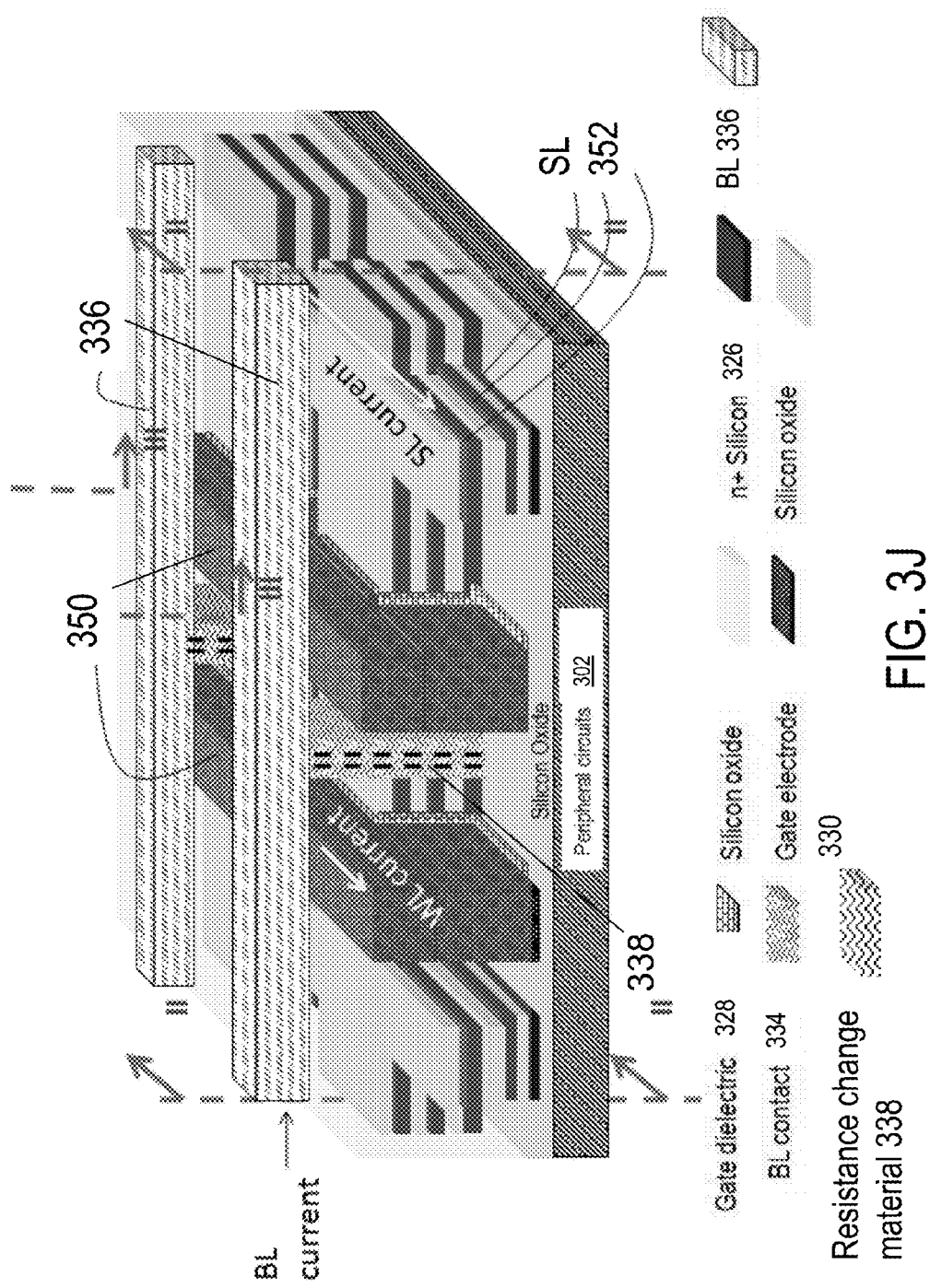
Figure 3K:
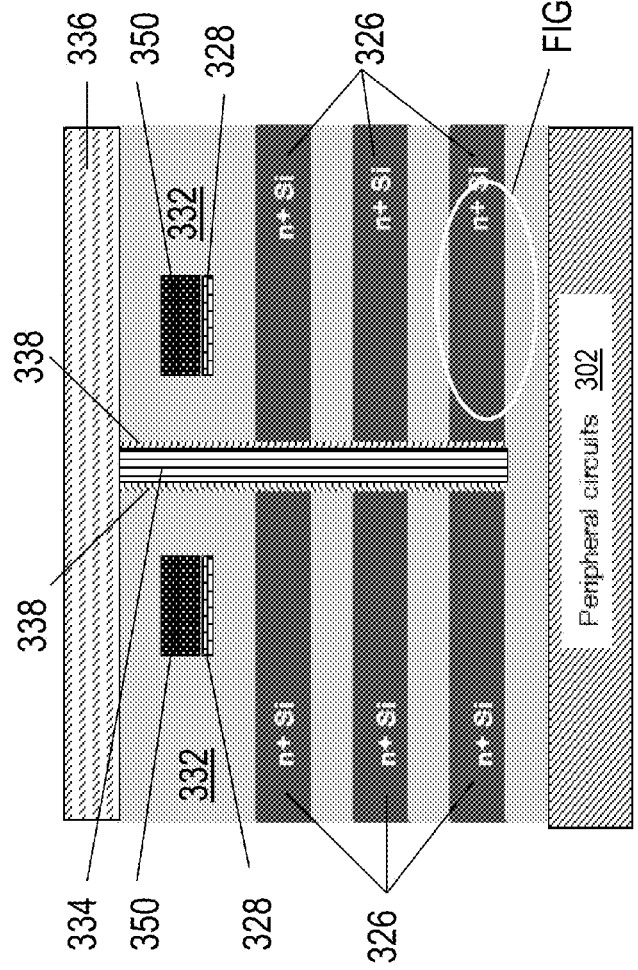
Figure 3K:
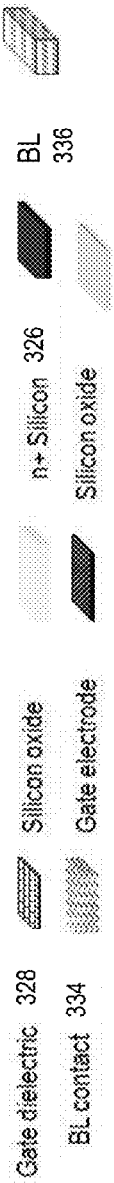
Figure 3L:
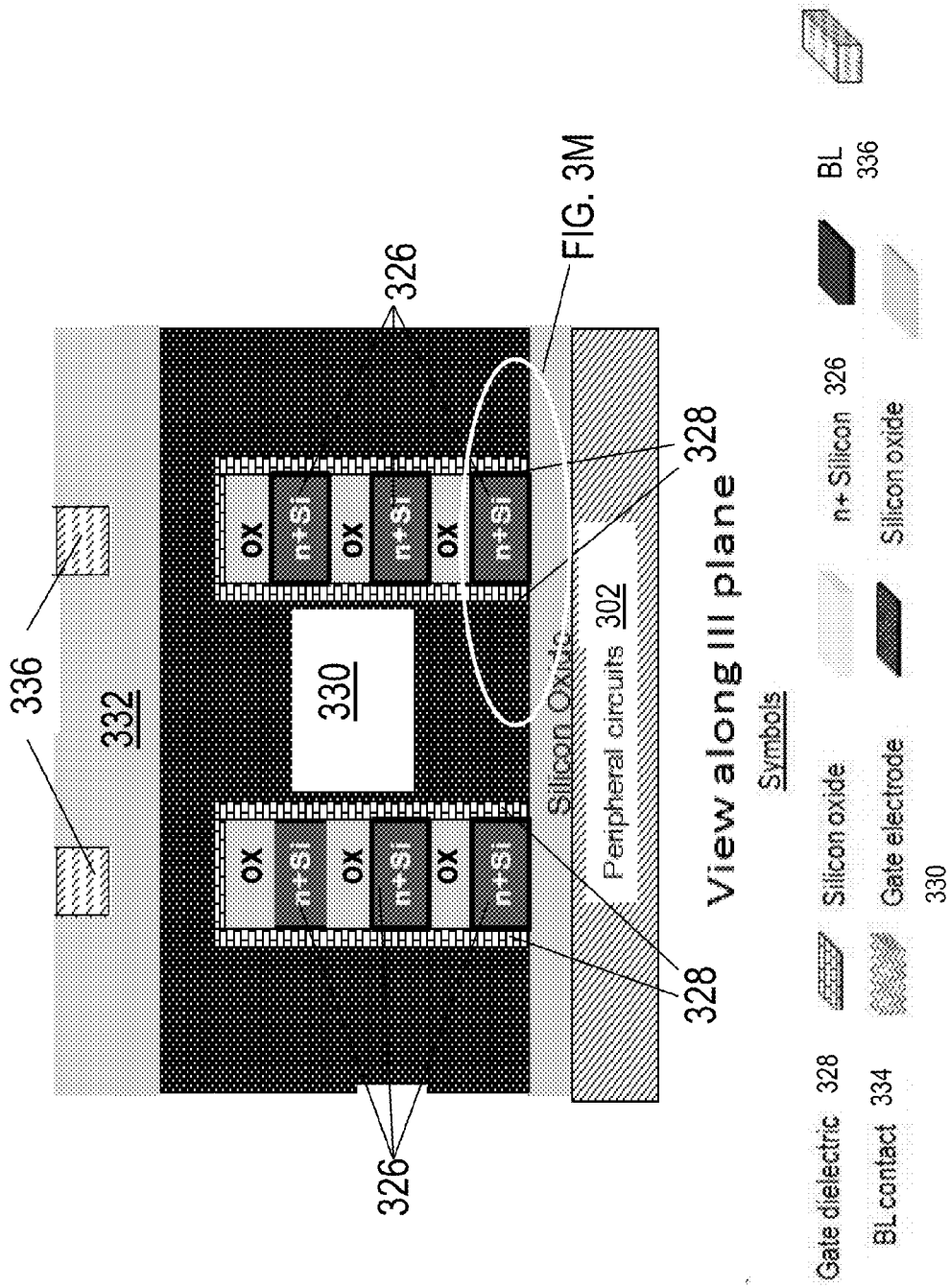

FIG. 3K shows a cross sectional cut II of FIG. 3J, while FIG. 3L shows a cross-sectional cut III of FIG. 3J. FIG. 3K shows BL metal line 336, oxide 332, BL contact/electrode 334, resistive change material 338, WL regions 350, gate dielectric 328, N+ silicon regions 326, and peripheral circuits substrate 302. The BL contact/electrode 334 couples to one side of the three levels of resistive change material 338. The other side of the resistive change material 338 is coupled to N+ regions 326. FIG. 3L shows BL metal lines 336, oxide 332, gate electrode 330, gate dielectric 328, N+ silicon regions 326, interlayer oxide region ('ox'), and peripheral circuits substrate 302. The gate electrode 330 is common to substantially all six N+ silicon regions 326 and forms six two-sided gated junction-less transistors as memory select transistors.

As illustrated in FIG. 3M, a single exemplary two-sided gate junction-less transistor on the first Si/SiO2 layer 323 may include N+ silicon region 326 (functioning as the source, drain, and transistor channel), and two gate electrodes 330 with associated gate dielectrics 328. The transistor is electrically isolated from beneath by oxide layer 308.

This flow may enable the formation of a resistance-based multi-layer or 3D memory array with zero additional masking steps per memory layer, which utilizes junction-less transistors and has a resistance-based memory element in series with a select transistor, and is constructed by layer transfers of wafer sized doped mono-crystalline silicon layers, and this 3D memory array may be connected to an underlying multi-metal layer semiconductor device.

Persons of ordinary skill in the art will appreciate that the illustrations in FIGS. 3A through 3M are exemplary only and are not drawn to scale. Such skilled persons will further appreciate that many variations are possible such as, for example, the transistors may be of another type such as RCATs. Additionally, doping of each N+ layer may be slightly different to compensate for interconnect resistances. Moreover, the stacked memory layer may be connected to a periphery circuit that is above the memory stack. Further, each gate of the double gate 3D resistance based memory can be independently controlled for better control of the memory cell. Many other modifications within the scope of the invention will suggest themselves to such skilled persons after reading this specification. Thus the invention is to be limited only by the appended claims.

The monolithic 3D integration concepts described in this patent application can lead to novel embodiments of poly-crystalline silicon based memory architectures. While the below concepts in FIGS. 4 and 5 are explained by using resistive memory architectures as an example, it will be clear to one skilled in the art that similar concepts can be applied to the NAND flash, charge trap, and DRAM memory architectures and process flows described previously in this patent application.

As illustrated in FIGS. 4A to 4K, a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage and has a resistance-based memory element in series with a select or access transistor.

Figure 4A:
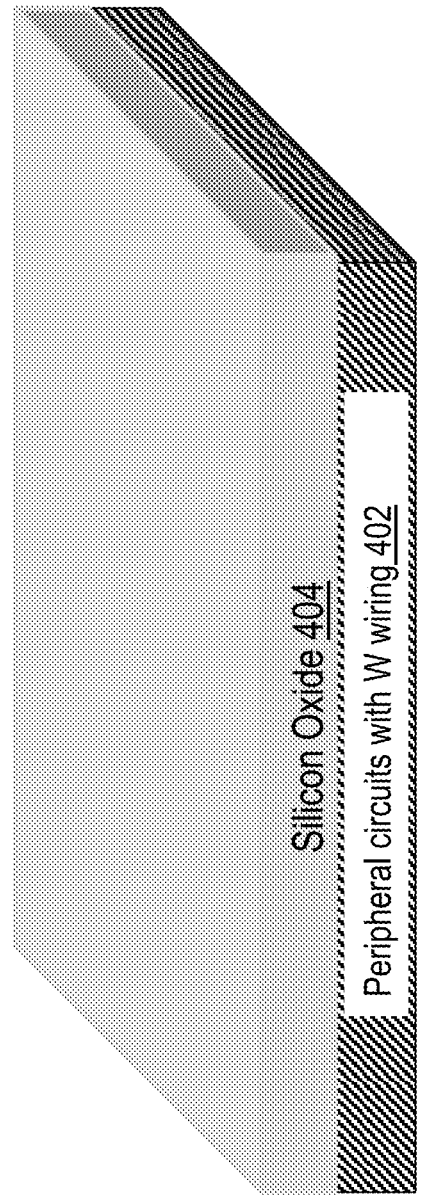

As illustrated in FIG. 4A, a silicon substrate with peripheral circuitry 402 may be constructed with high temperature (greater than approximately 400° C.) resistant wiring, such as, for example, Tungsten. The peripheral circuitry substrate 402 may include memory control circuits as well as circuitry for other purposes and of various types, such as, for example, analog, digital, RF, or memory. The peripheral circuitry substrate 402 may include peripheral circuits that can withstand an additional rapid-thermal-anneal (RTA) and still remain operational and retain good performance. For this purpose, the peripheral circuits may be formed such that they have been subject to a partial or weak RTA or no RTA for activating dopants. Silicon oxide layer 404 is deposited on the top surface of the peripheral circuitry substrate.

Figure 4B:
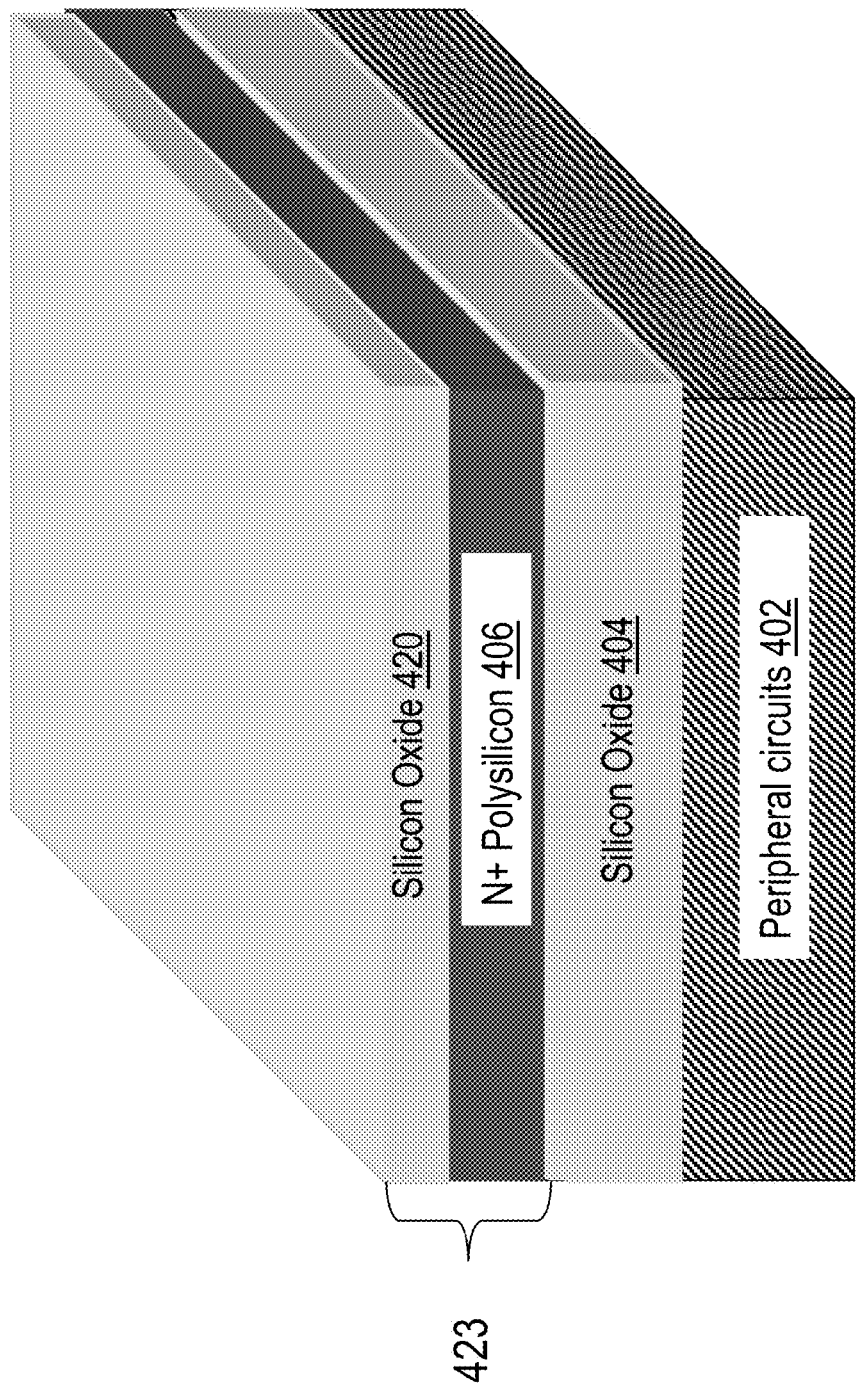

As illustrated in FIG. 4B, a layer of N+ doped poly-crystalline or amorphous silicon 406 may be deposited. The amorphous silicon or poly-crystalline silicon layer 406 may be deposited using a chemical vapor deposition process, such as LPCVD or PECVD, or other process methods, and may be deposited doped with N+ dopants, such as Arsenic or Phosphorous, or may be deposited un-doped and subsequently doped with, such as, ion implantation or PLAD (PLasma Assisted Doping) techniques. Silicon Oxide 420 may then be deposited or grown. This now forms the first Si/SiO2 layer 423 which includes N+ doped poly-crystalline or amorphous silicon layer 406 and silicon oxide layer 420.

Figure 4C:
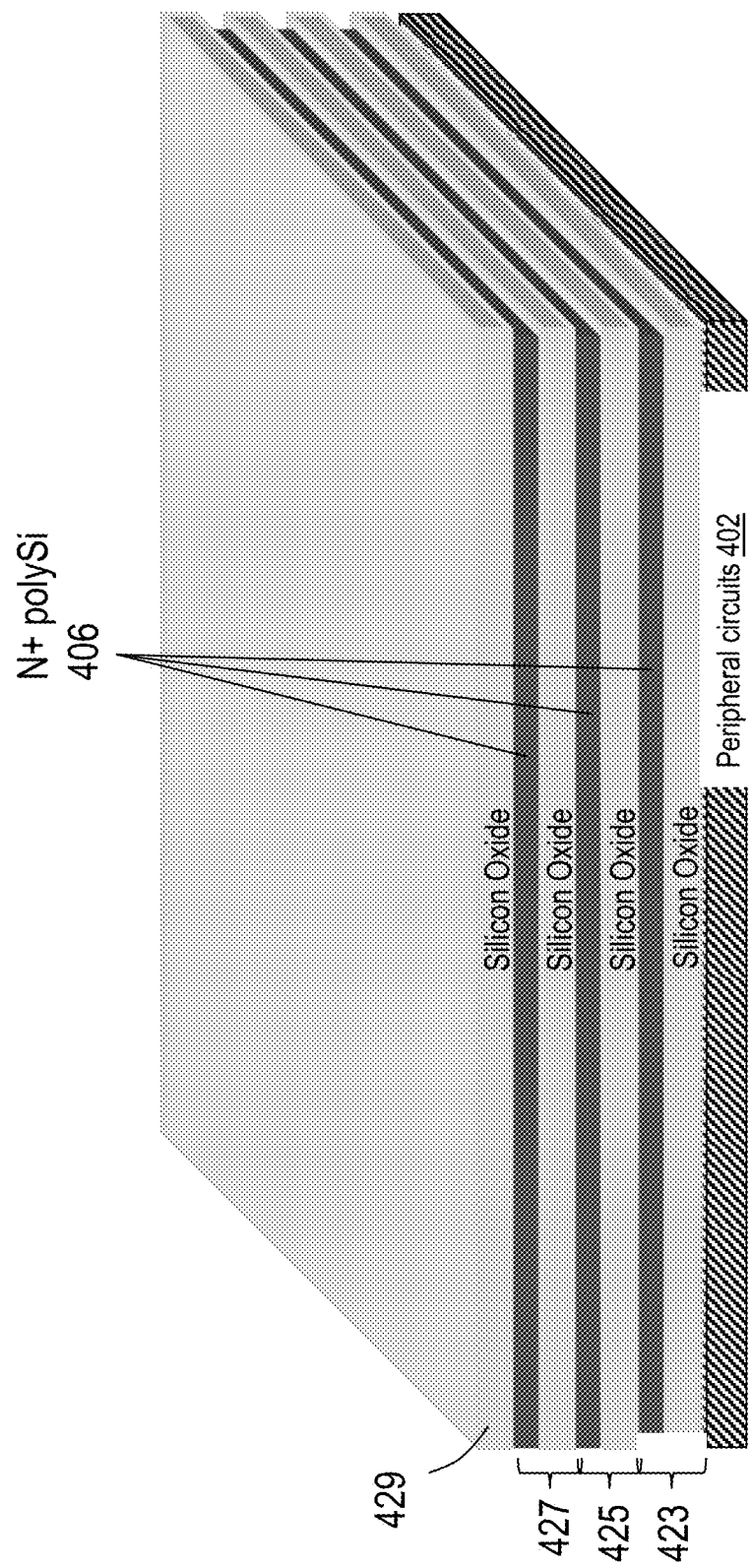

As illustrated in FIG. 4C, additional Si/SiO2 layers, such as, for example, second Si/SiO2 layer 425 and third Si/SiO2 layer 427, may each be formed as described in FIG. 4B. Oxide layer 429 may be deposited to electrically isolate the top N+ doped poly-crystalline or amorphous silicon layer.

Figure 4D:
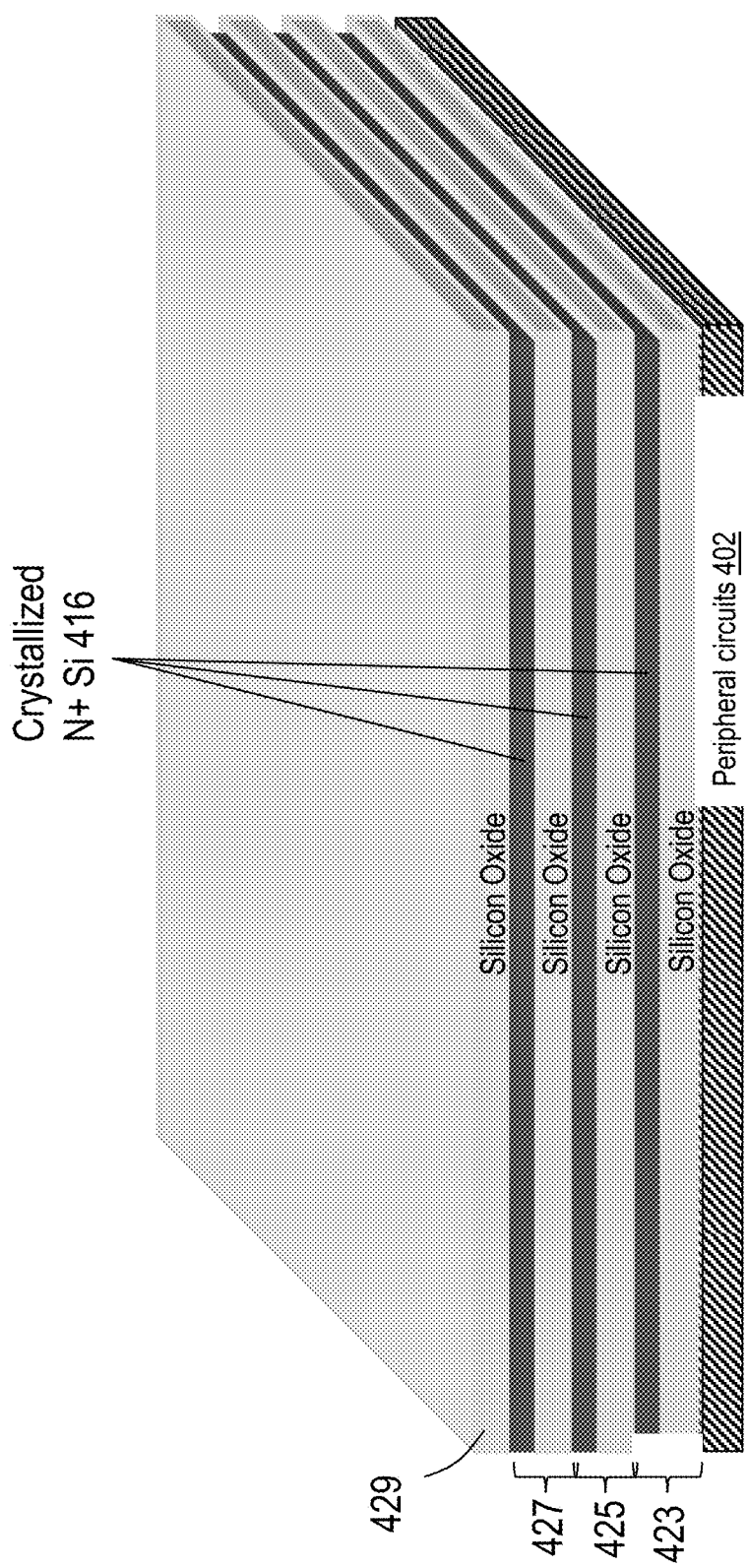

As illustrated in FIG. 4D, a Rapid Thermal Anneal (RTA) is conducted to crystallize the N+ doped poly-crystalline silicon or amorphous silicon layers 406 of first Si/SiO2 layer 423, second Si/SiO2 layer 425, and third Si/SiO2 layer 427, forming crystallized N+ silicon layers 416. Temperatures during this RTA may be as high as approximately 800° C. Alternatively, an optical anneal, such as, for example, a laser anneal, could be performed alone or in combination with the RTA or other annealing processes.

Figure 4E:
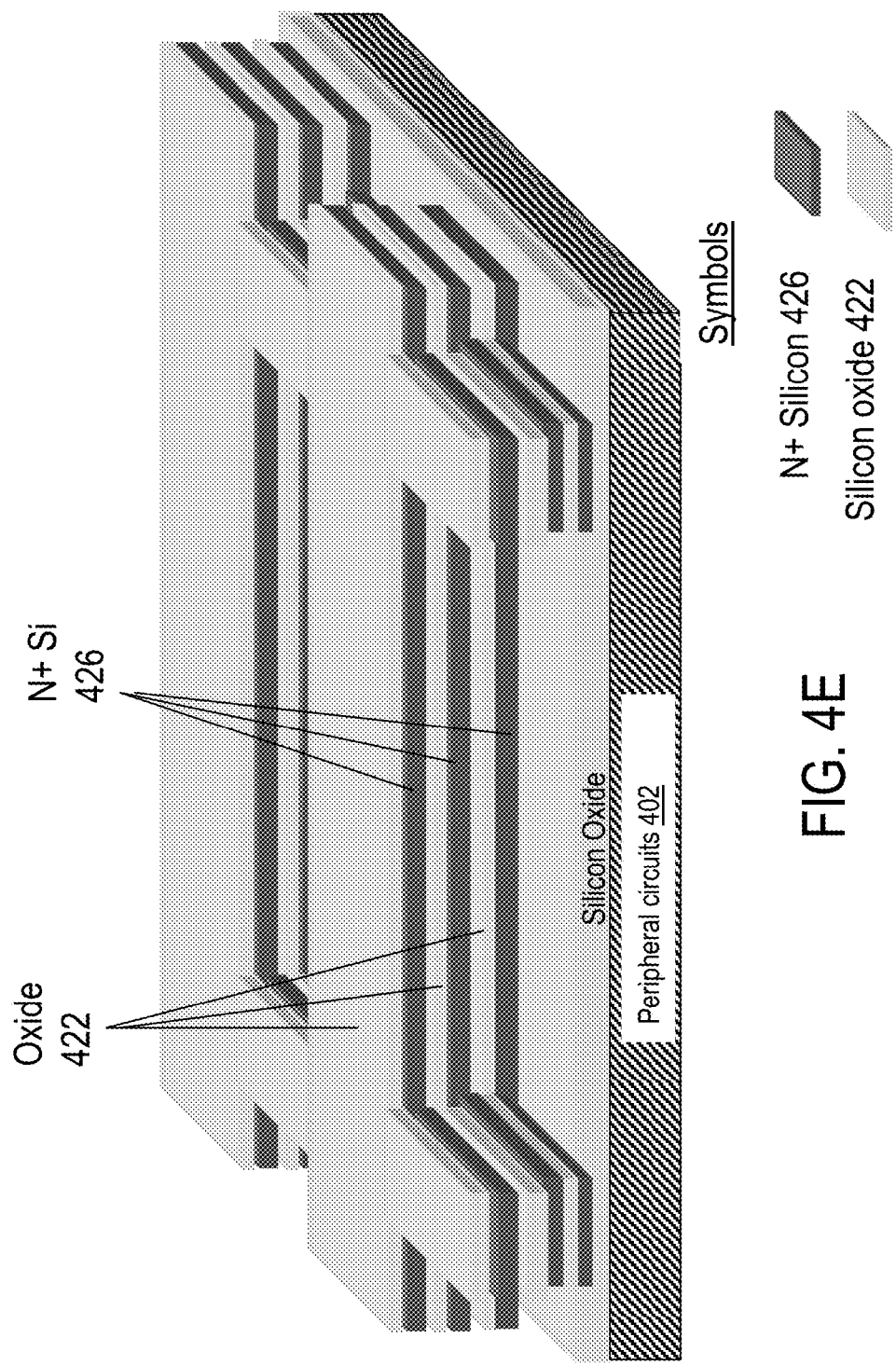

As illustrated in FIG. 4E, oxide 429, third Si/SiO2 layer 427, second Si/SiO2 layer 425 and first Si/SiO2 layer 423 may be lithographically defined and plasma/RIE etched to form a portion of the memory cell structure, which now includes multiple layers of regions of crystallized N+ silicon 426 (previously crystallized N+ silicon layers 416) and oxide 422.

Figure 4F:
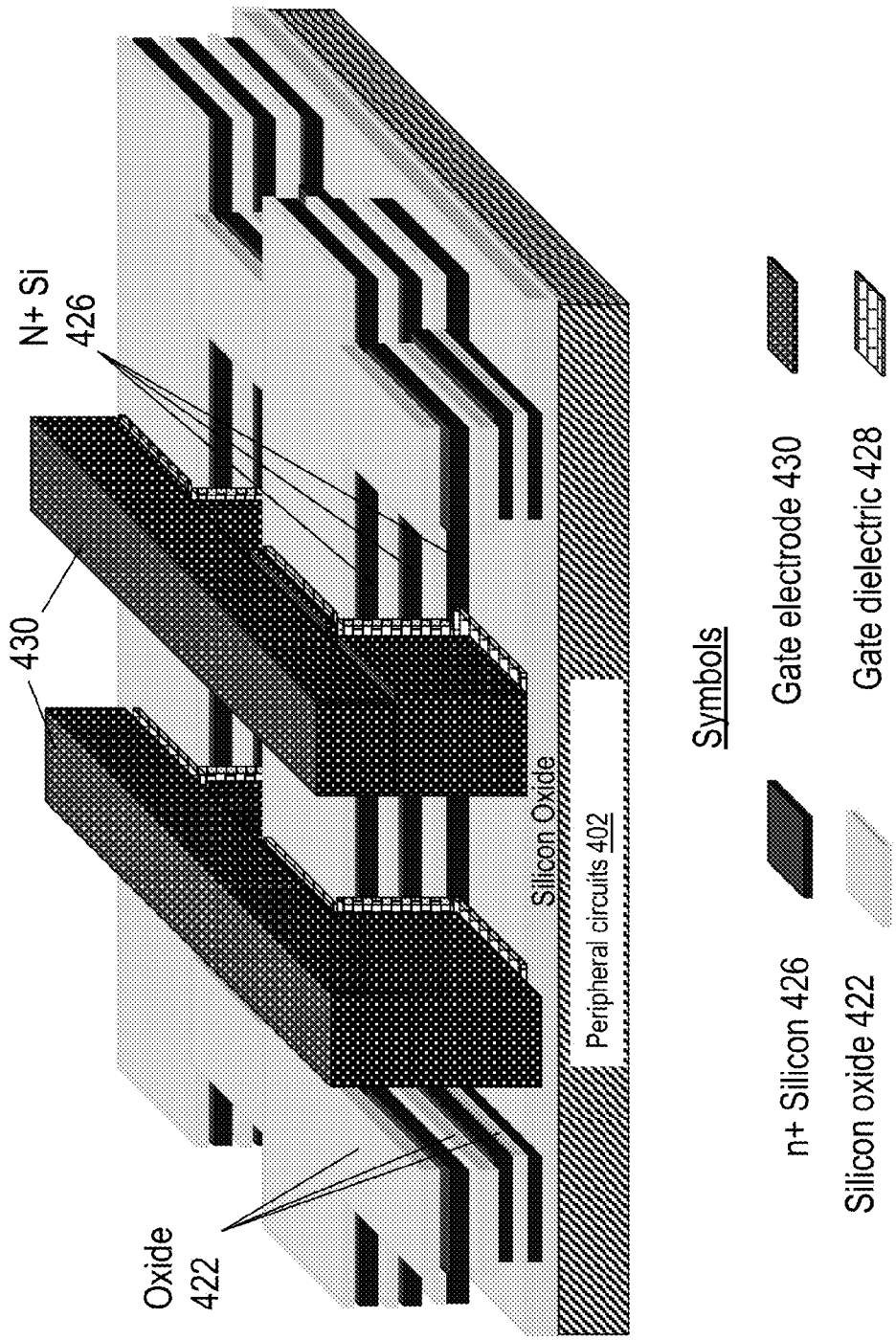

As illustrated in FIG. 4F, a gate dielectric and gate electrode material may be deposited, planarized with a chemical mechanical polish (CMP), and then lithographically defined and plasma/RIE etched to form gate dielectric regions 428 which may either be self aligned to and covered by gate electrodes 430 (shown), or cover the entire crystallized N+ silicon regions 426 and oxide regions 422 multi-layer structure. The gate stack including gate electrode 430 and gate dielectric 428 may be formed with a gate dielectric, such as thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Furthermore, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 4G:
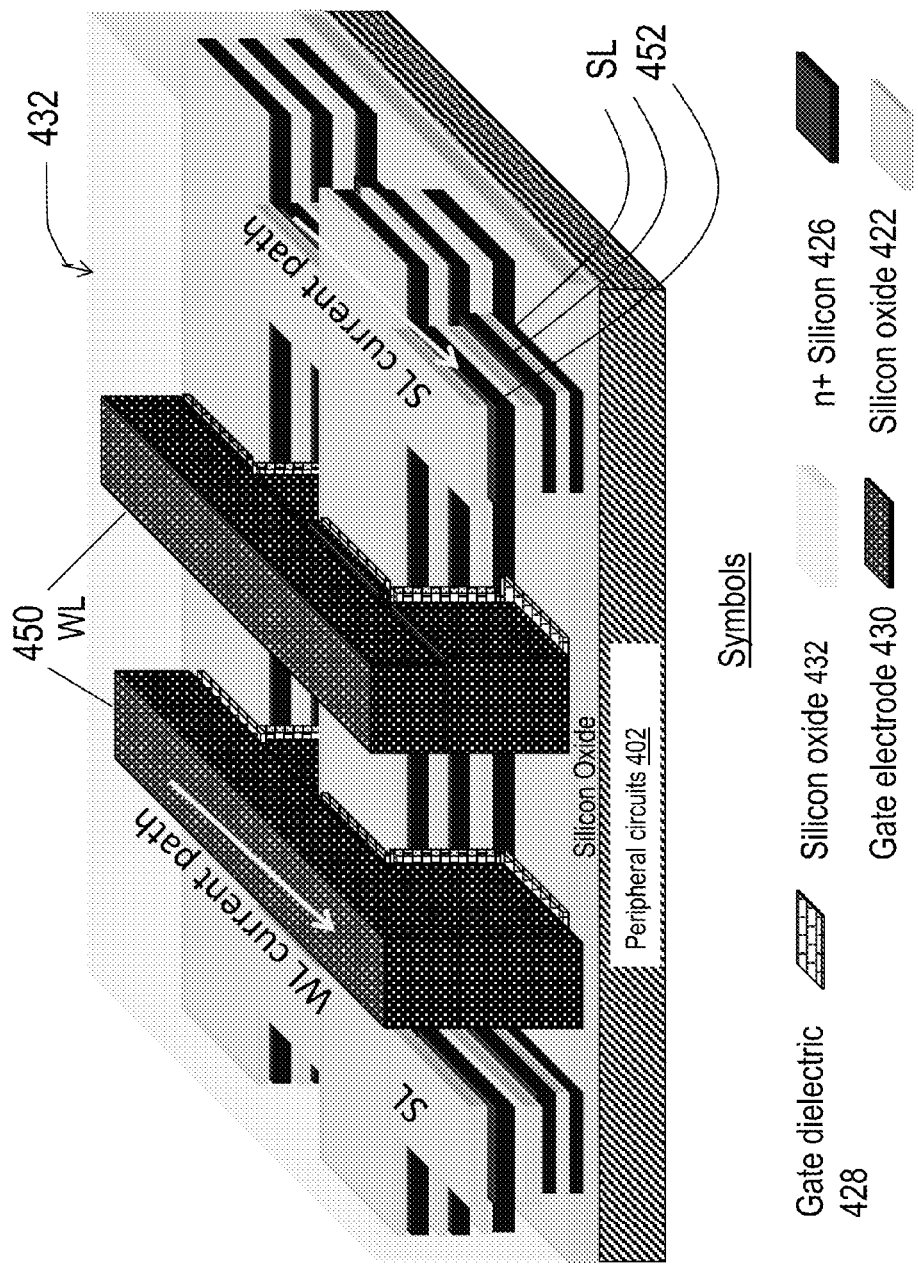

As illustrated in FIG. 4G, the entire structure may be covered with a gap fill oxide 432, which may be planarized with chemical mechanical polishing. The oxide 432 is shown transparently in the figure for clarity, along with word-line regions (WL) 450, coupled with and composed of gate electrodes 430, and source-line regions (SL) 452, composed of crystallized N+ silicon regions 426.

Figure 4H:
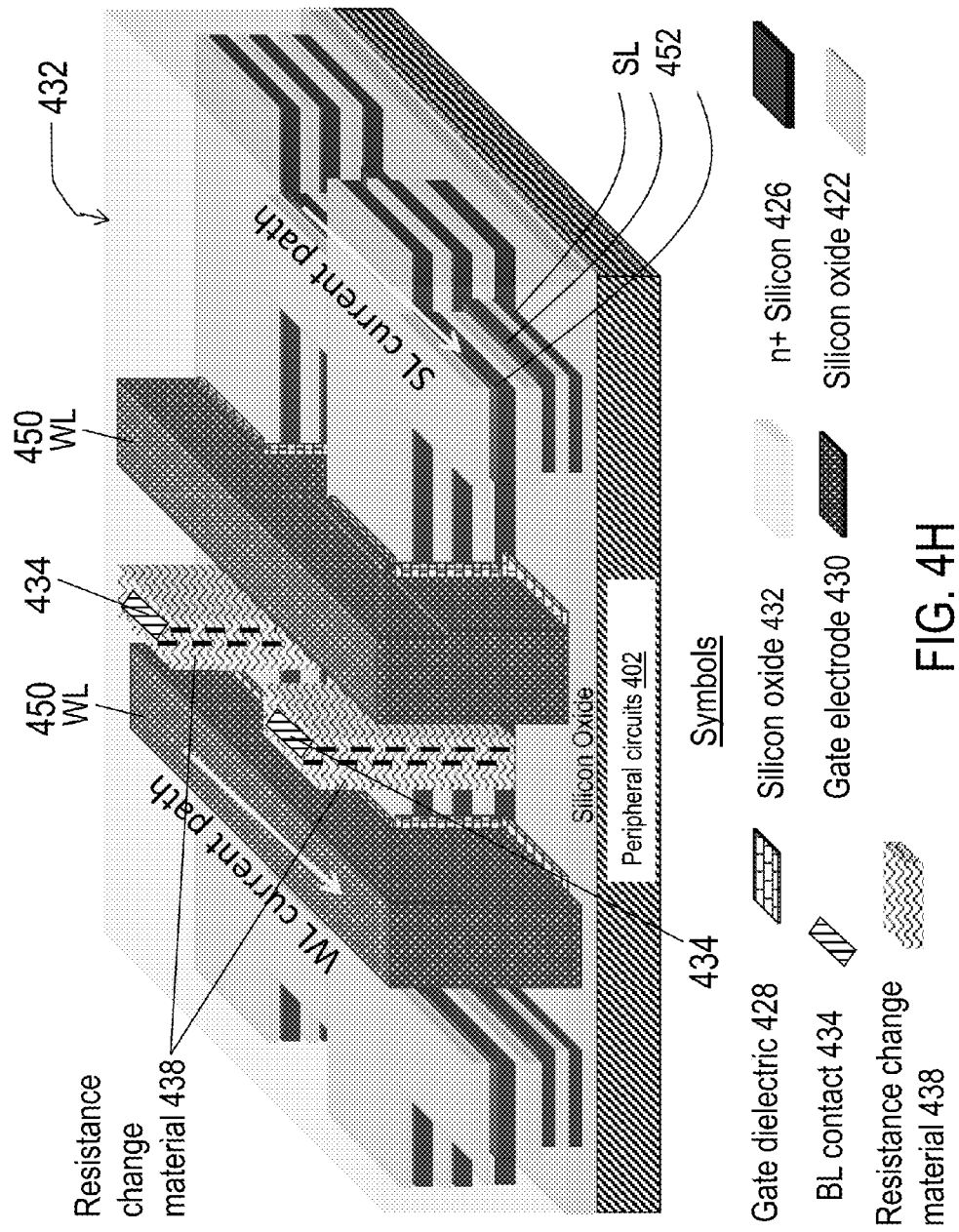

As illustrated in FIG. 4H, bit-line (BL) contacts 434 may be lithographically defined, etched with plasma/RIE through oxide 432, the three crystallized N+ silicon regions 426, and associated oxide vertical isolation regions to connect substantially all memory layers vertically, and photoresist removed. Resistance change memory material 438, such as, for example, hafnium oxides or titanium oxides, may then be deposited, preferably with atomic layer deposition (ALD). The electrode for the resistance change memory element may then be deposited by ALD to form the electrode/BL contact 434. The excess deposited material may be polished to planarity at or below the top of oxide 432. Each BL contact 434 with resistive change material 438 may be shared among substantially all layers of memory, shown as three layers of memory in FIG. 4H.

Figure 4I:
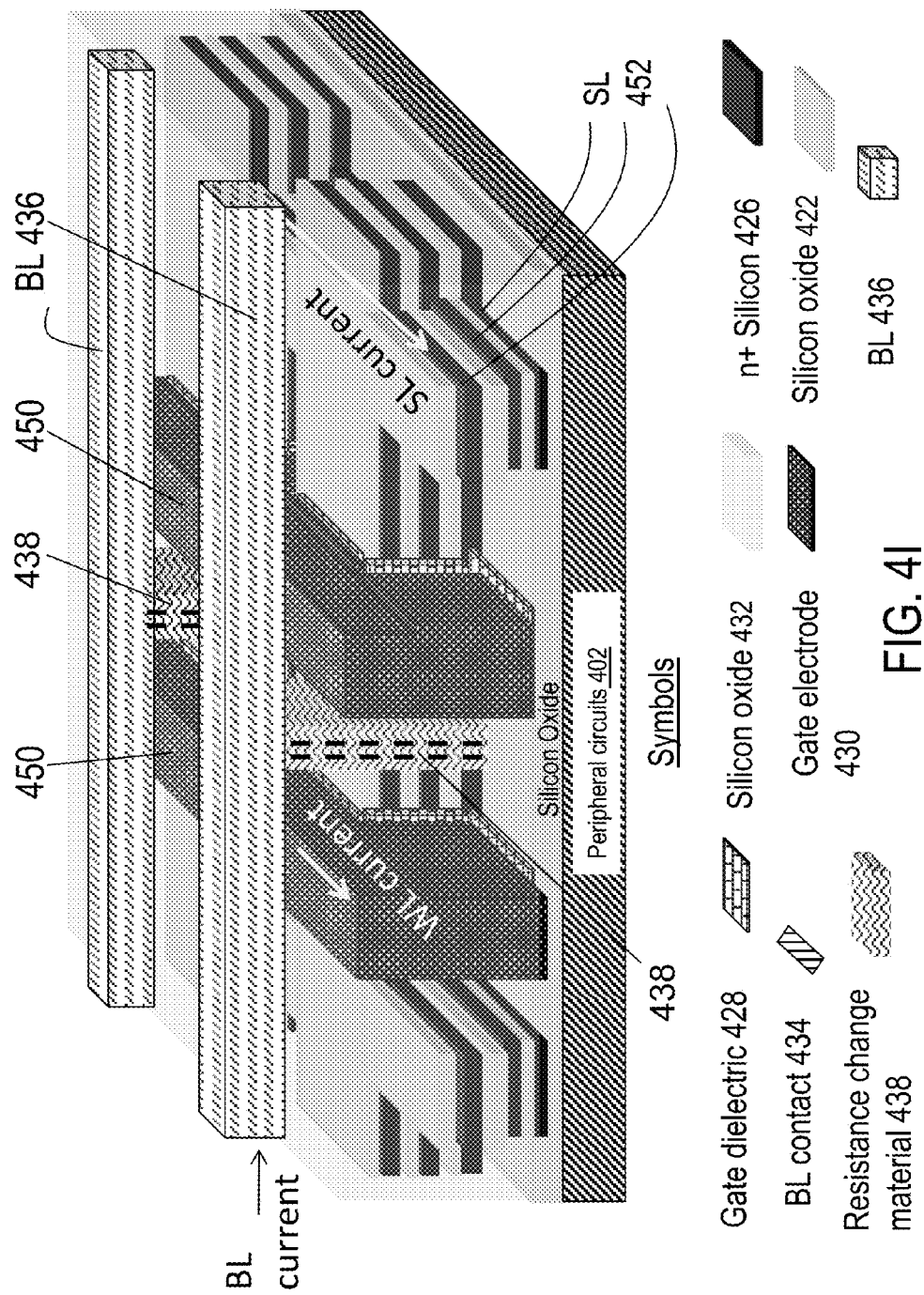

As illustrated in FIG. 4I, BL metal lines 436 may be formed and connected to the associated BL contacts 434 with resistive change material 438. Contacts and associated metal interconnect lines (not shown) may be formed for the WL and SL at the memory array edges. A thru layer via 460 (not shown) may be formed to electrically couple the BL, SL, and WL metallization to the acceptor substrate peripheral circuitry via an acceptor wafer metal connect pad 480 (not shown).

Figure 4J:
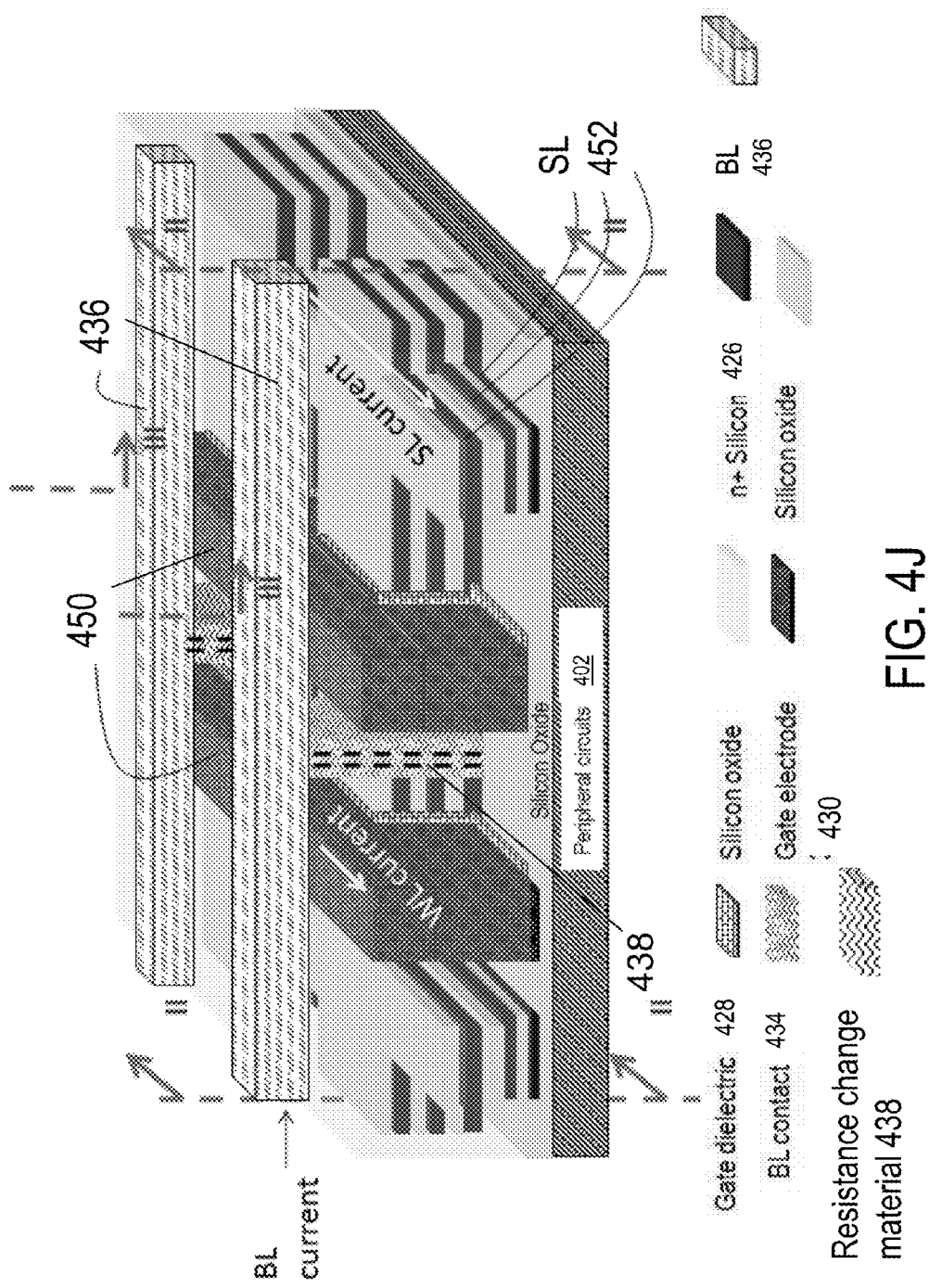

FIG. 4K is a cross sectional cut II view of FIG. 4J, while FIG. 4L is a cross sectional cut III view of FIG. 4J. FIG. 4K shows BL metal line 436, oxide 432, BL contact/electrode 434, resistive change material 438, WL regions 450, gate dielectric 428, crystallized N+ silicon regions 426, and peripheral circuits substrate 402. The BL contact/electrode 434 couples to one side of the three levels of resistive change material 438. The other side of the resistive change material 438 is coupled to crystallized N+ regions 426. FIG. 4L shows BL metal lines 436, oxide 432, gate electrode 430, gate dielectric 428, crystallized N+ silicon regions 426, interlayer oxide region ('ox'), and peripheral circuits substrate 402. The gate electrode 430 is common to substantially all six crystallized N+ silicon regions 426 and forms six two-sided gated junction-less transistors as memory select transistors.

Figure 4M:
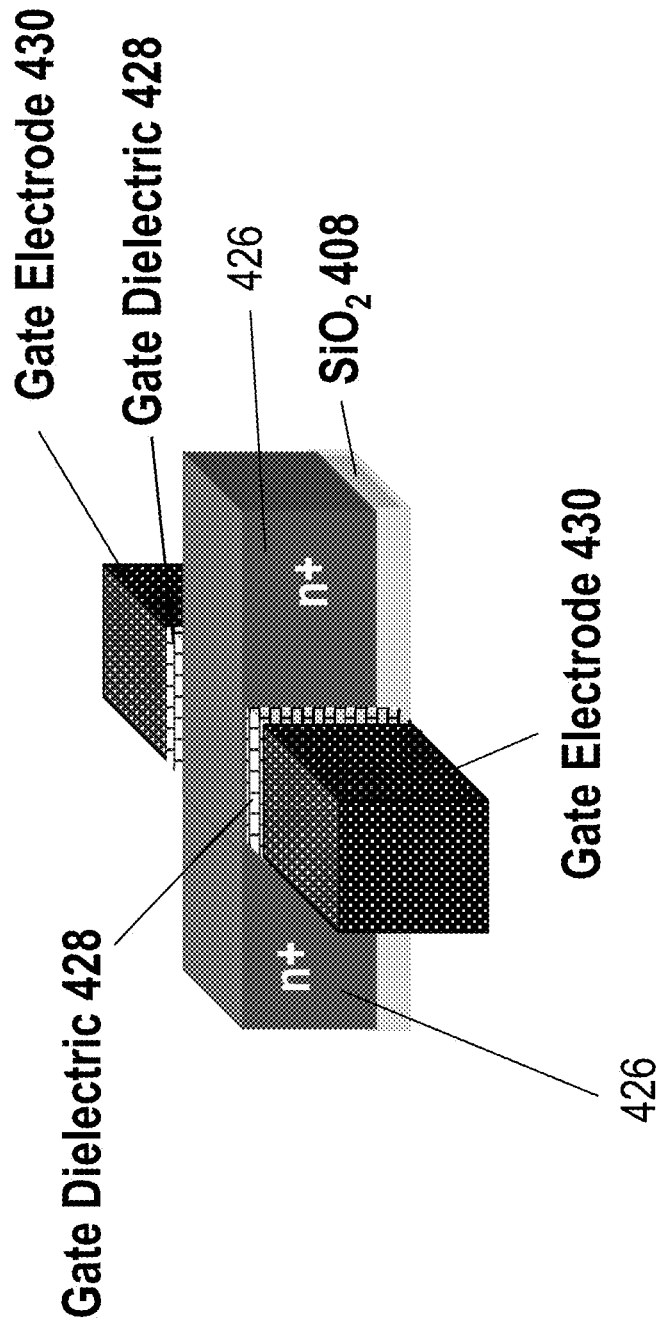

As illustrated in FIG. 4M, a single exemplary two-sided gated junction-less transistor on the first Si/SiO2 layer 423 may include crystallized N+ silicon region 426 (functioning as the source, drain, and transistor channel), and two gate electrodes 430 with associated gate dielectrics 428. The transistor is electrically isolated from beneath by oxide layer 408.

This flow may enable the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped poly-crystalline silicon layers, and this 3D memory array may be connected to an underlying multi-metal layer semiconductor device.

Persons of ordinary skill in the art will appreciate that the illustrations in FIGS. 4A through 4M are exemplary only and are not drawn to scale. Such skilled persons will further appreciate that many variations are possible such as, for example, the RTAs and/or optical anneals of the N+ doped poly-crystalline or amorphous silicon layers 406 as described for FIG. 4D may be performed after each Si/SiO2 layer is formed in FIG. 4C. Additionally, N+ doped poly-crystalline or amorphous silicon layer 406 may be doped P+, or with a combination of dopants and other polysilicon network modifiers to enhance the RTA or optical annealing and subsequent crystallization and lower the N+ silicon layer 416 resistivity. Moreover, doping of each crystallized N+ layer may be slightly different to compensate for interconnect resistances. Furthermore, each gate of the double gated 3D resistance based memory can be independently controlled for better control of the memory cell. Many other modifications within the scope of the invention will suggest themselves to such skilled persons after reading this specification. Thus the invention is to be limited only by the appended claims.

As illustrated in FIGS. 5A to 5J, an alternative embodiment of a resistance-based 3D memory with zero additional masking steps per memory layer may be constructed with methods that are suitable for 3D IC manufacturing. This 3D memory utilizes poly-crystalline silicon junction-less transistors that may have either a positive or a negative threshold voltage, a resistance-based memory element in series with a select or access transistor, and may have the periphery circuitry layer formed or layer transferred on top of the 3D memory array.

Figure 5A:
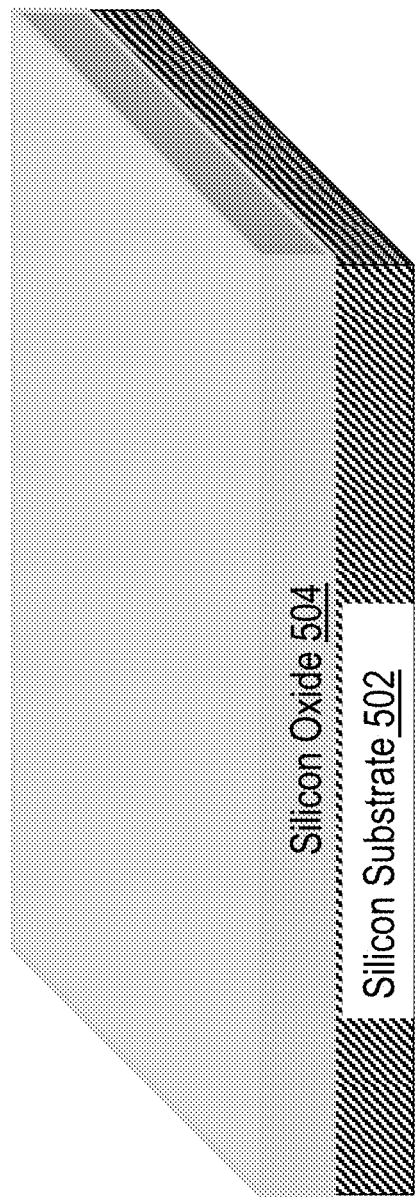
FIGS. 5A-5J are drawing illustrations of the formation of a resistive memory transistor with periphery on top.

As illustrated in FIG. 5A, a silicon oxide layer 504 may be deposited or grown on top of silicon substrate 502.

Figure 5B:
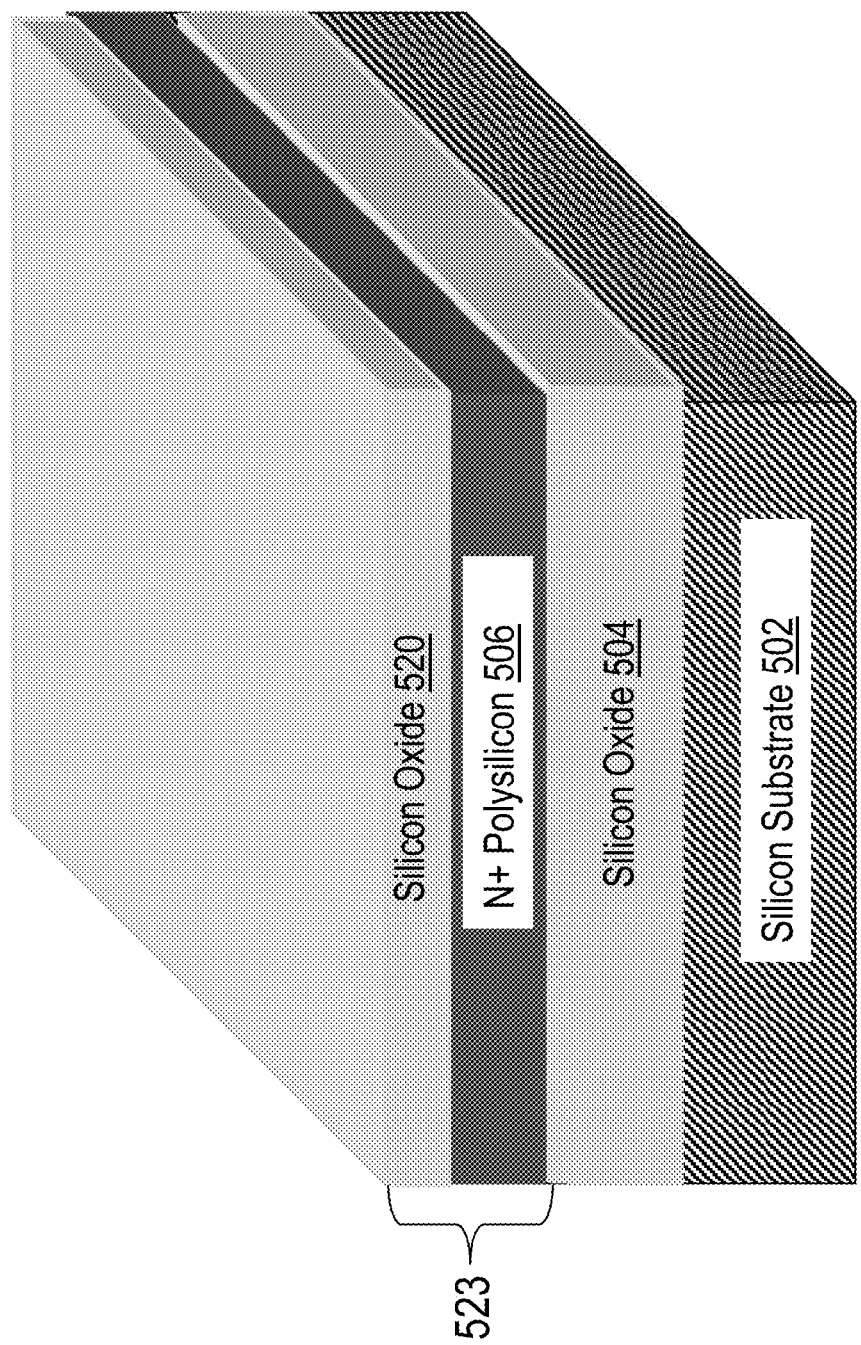

As illustrated in FIG. 5B, a layer of N+ doped poly-crystalline or amorphous silicon 506 may be deposited. The amorphous silicon or poly-crystalline silicon layer 506 may be deposited using a chemical vapor deposition process, such as LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 520 may then be deposited or grown. This now forms the first Si/SiO2 layer 523 comprised of N+ doped poly-crystalline or amorphous silicon layer 506 and silicon oxide layer 520.

Figure 5C:
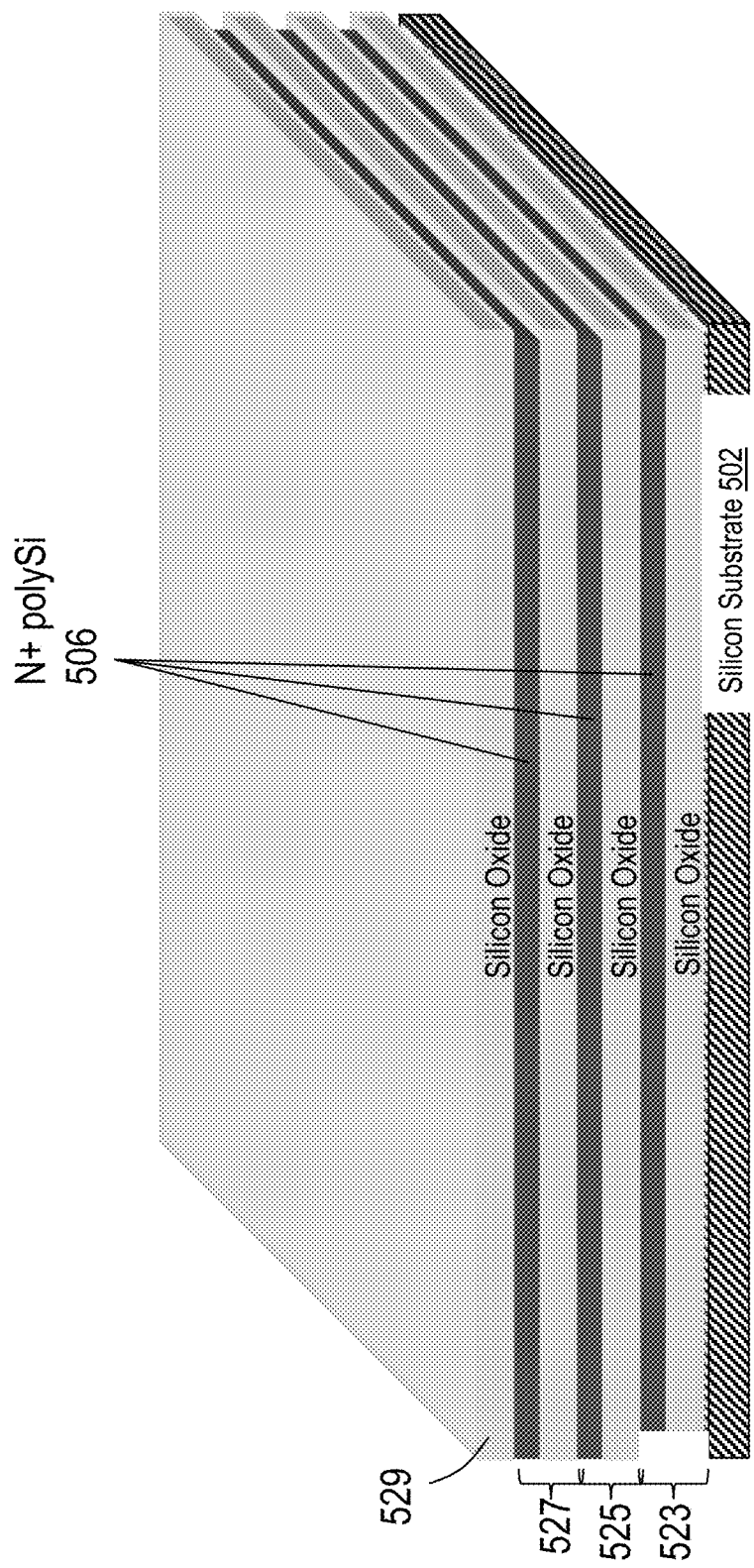

As illustrated in FIG. 5C, additional Si/SiO2 layers, such as, for example, second Si/SiO2 layer 525 and third Si/SiO2 layer 527, may each be formed as described in FIG. 5B. Oxide layer 529 may be deposited to electrically isolate the top N+ doped poly-crystalline or amorphous silicon layer.

Figure 5D:
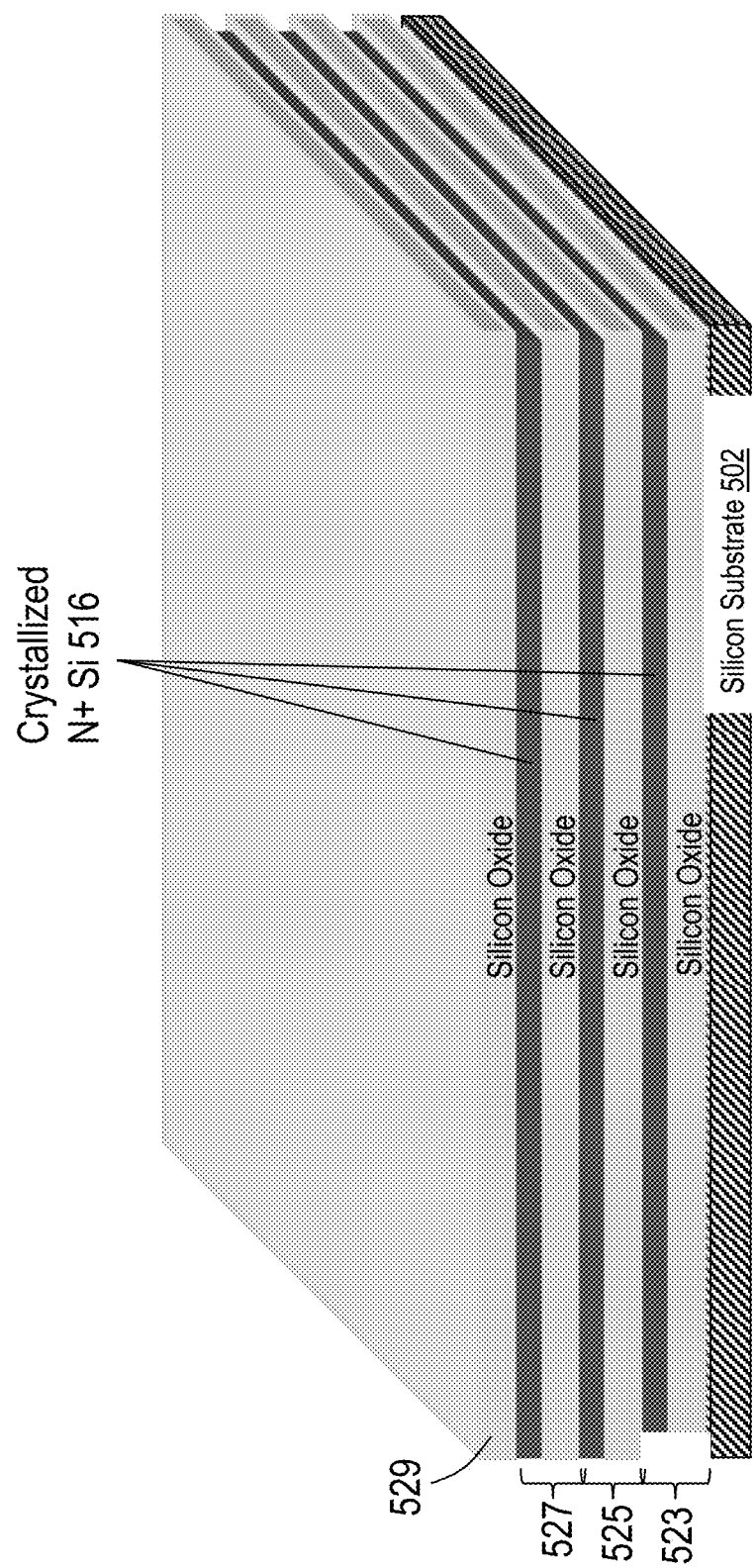

As illustrated in FIG. 5D, a Rapid Thermal Anneal (RTA) is conducted to crystallize the N+ doped poly-crystalline silicon or amorphous silicon layers 506 of first Si/SiO2 layer 523, second Si/SiO2 layer 525, and third Si/SiO2 layer 527, forming crystallized N+ silicon layers 516. Alternatively, an optical anneal, such as, for example, a laser anneal, could be performed alone or in combination with the RTA or other annealing processes. Temperatures during this step could be as high as approximately 700° C., and could even be as high as, for example, 1400° C. Since there are no circuits or metallization underlying these layers of crystallized N+ silicon, very high temperatures (such as, for example, 1400° C.) can be used for the anneal process, leading to very good quality poly-crystalline silicon with few grain boundaries and very high carrier mobilities approaching those of mono-crystalline crystal silicon.

Figure 5E:
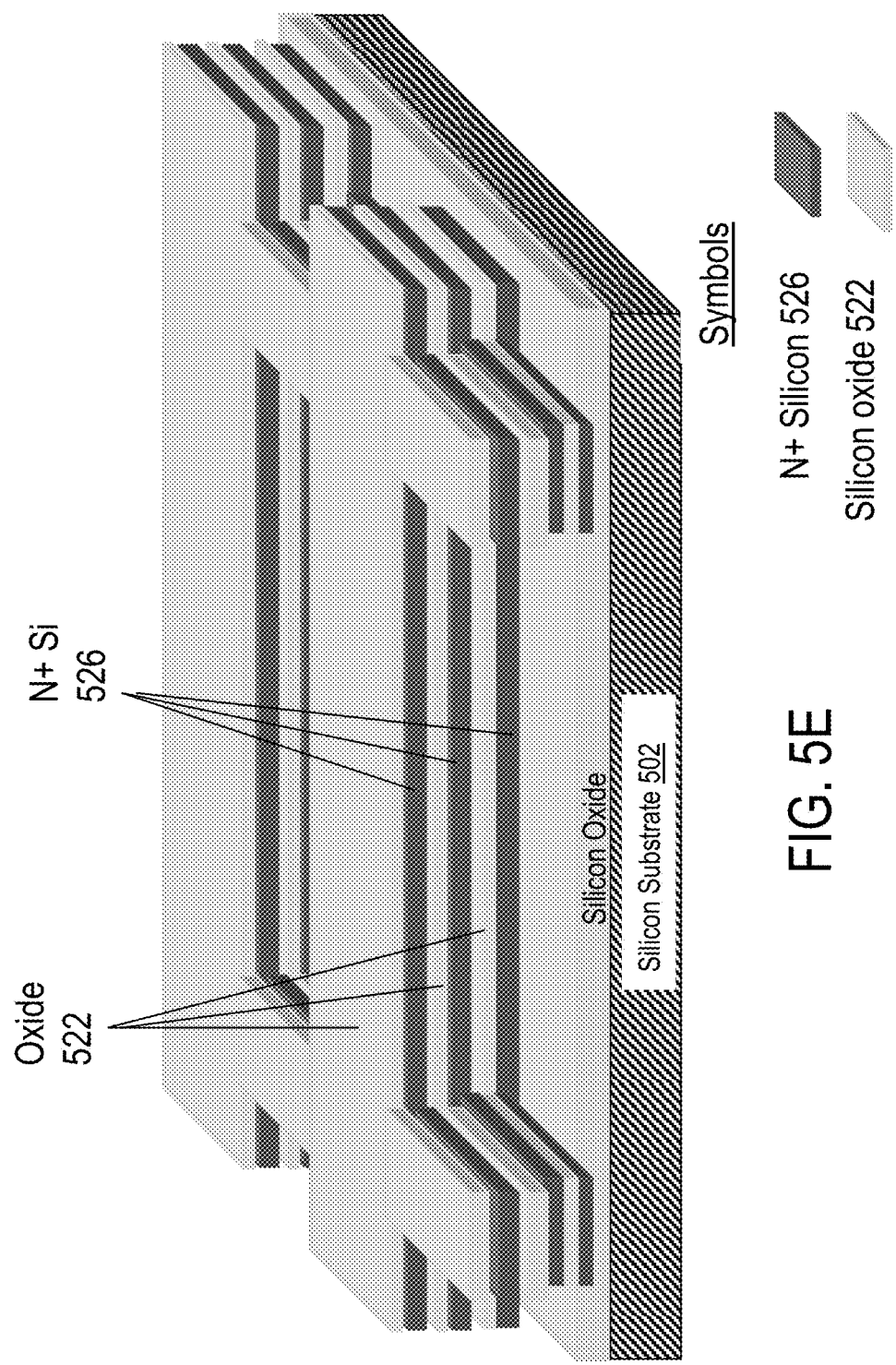

As illustrated in FIG. 5E, oxide 529, third Si/SiO2 layer 527, second Si/SiO2 layer 525 and first Si/SiO2 layer 523 may be lithographically defined and plasma/RIE etched to form a portion of the memory cell structure, which now includes multiple layers of regions of crystallized N+ silicon 526 (previously crystallized N+ silicon layers 516) and oxide 522.

Figure 5F:
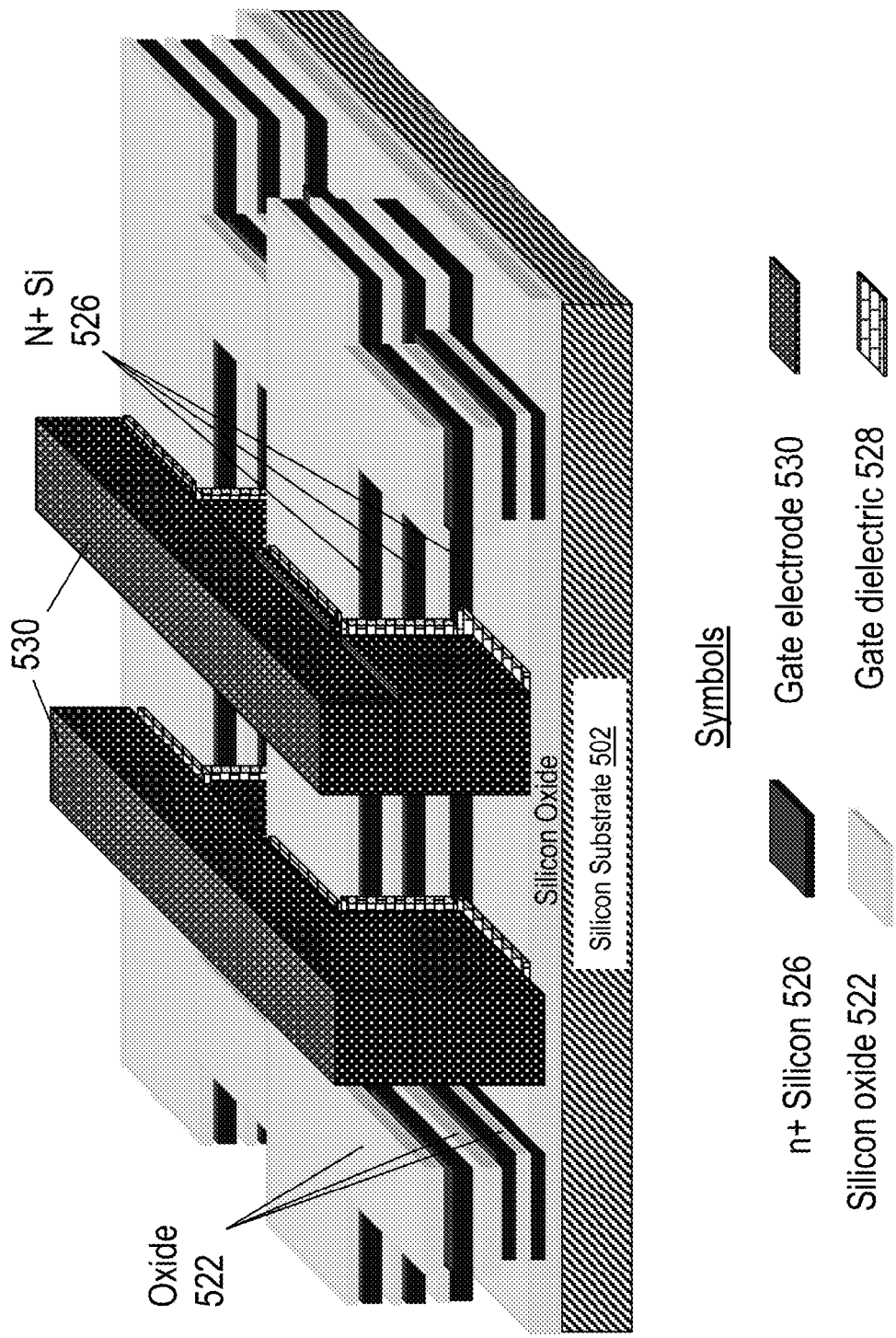

As illustrated in FIG. 5F, a gate dielectric and gate electrode material may be deposited, planarized with a chemical mechanical polish (CMP), and then lithographically defined and plasma/RIE etched to form gate dielectric regions 528 which may either be self aligned to and covered by gate electrodes 530 (shown), or cover the entire crystallized N+ silicon regions 526 and oxide regions 522 multi-layer structure. The gate stack including gate electrode 530 and gate dielectric 528 may be formed with a gate dielectric, such as thermal oxide, and a gate electrode material, such as poly-crystalline silicon. Alternatively, the gate dielectric may be an atomic layer deposited (ALD) material that is paired with a work function specific gate metal according to an industry standard of high k metal gate process schemes described previously. Additionally, the gate dielectric may be formed with a rapid thermal oxidation (RTO), a low temperature oxide deposition or low temperature microwave plasma oxidation of the silicon surfaces and then a gate electrode such as tungsten or aluminum may be deposited.

Figure 5G:
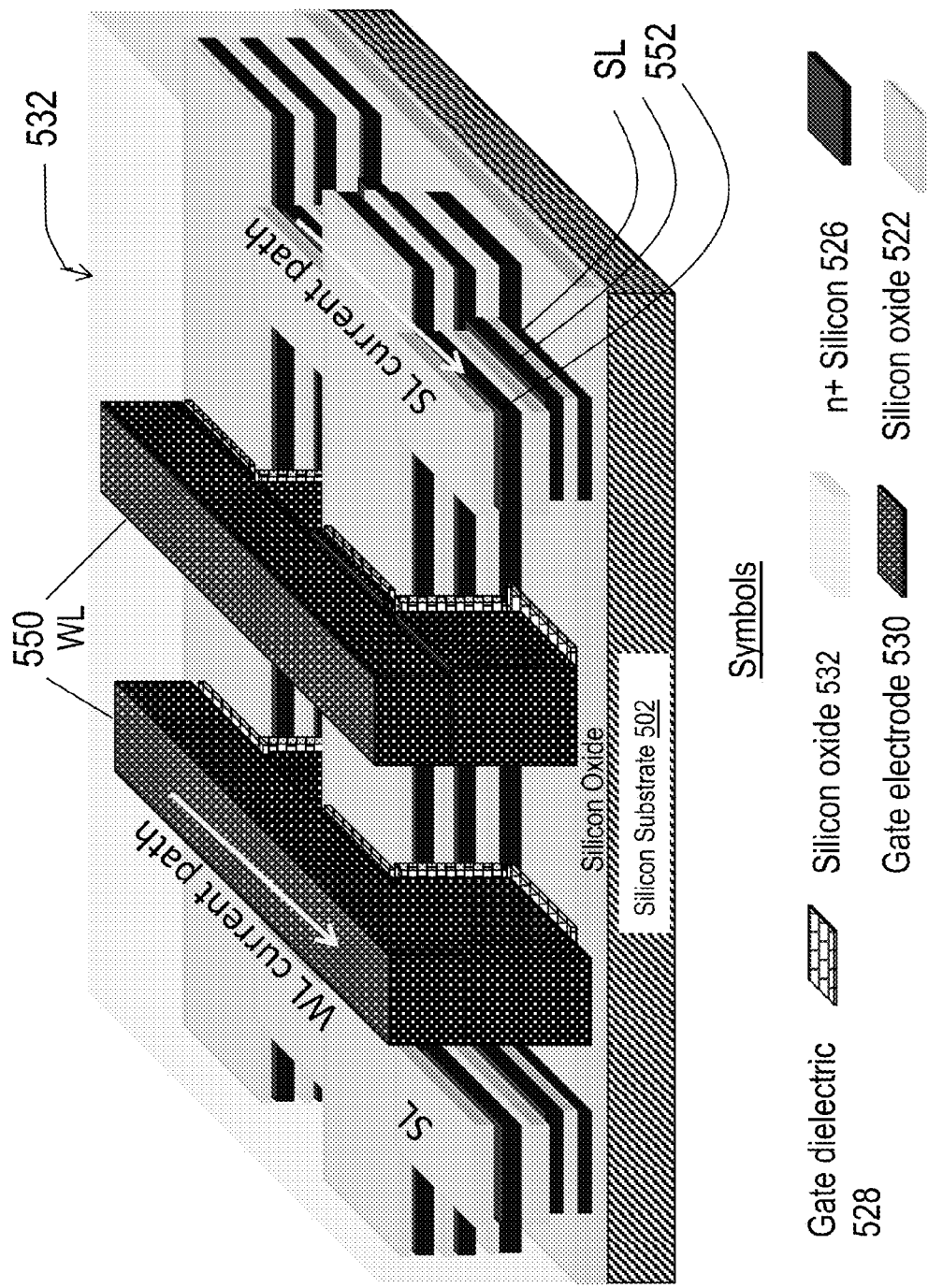

As illustrated in FIG. 5G, the entire structure may be covered with a gap fill oxide 532, which may be planarized with chemical mechanical polishing. The oxide 532 is shown transparently in the figure for clarity, along with word-line regions (WL) 550, coupled with and composed of gate electrodes 530, and source-line regions (SL) 552, composed of crystallized N+ silicon regions 526.

Figure 5H:
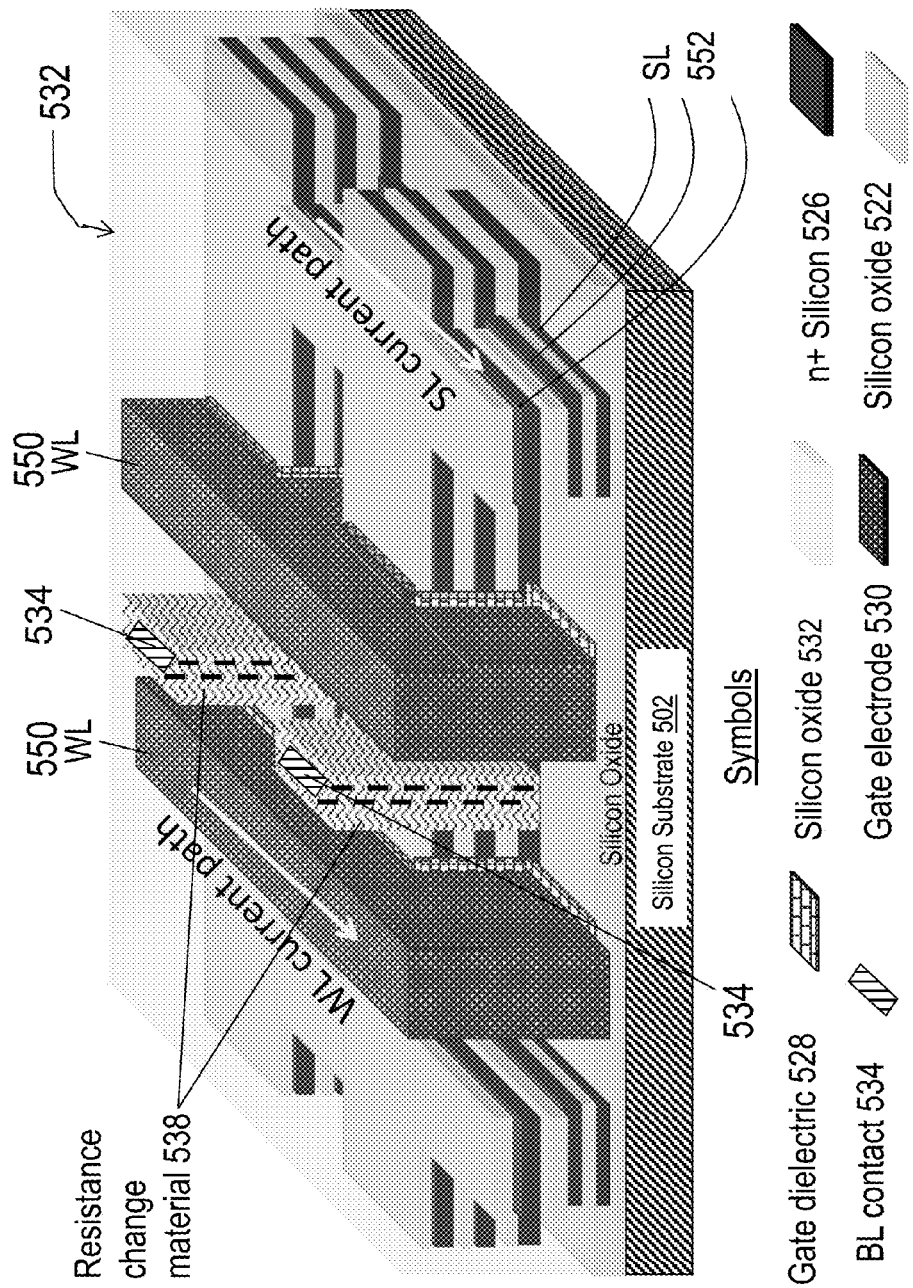

As illustrated in FIG. 5H, bit-line (BL) contacts 534 may be lithographically defined, etched along with plasma/RIE through oxide 532, the three crystallized N+ silicon regions 526, and the associated oxide vertical isolation regions to connect substantially all memory layers vertically. BL contacts 534 may then be processed by a photoresist removal. Resistance change memory material 538, such as hafnium oxides or titanium oxides, may then be deposited, preferably with atomic layer deposition (ALD). The electrode for the resistance change memory element may then be deposited by ALD to form the electrode/BL contact 534. The excess deposited material may be polished to planarity at or below the top of oxide 532. Each BL contact 534 with resistive change material 538 may be shared among substantially all layers of memory, shown as three layers of memory in FIG. 5H.

Figure 5I:
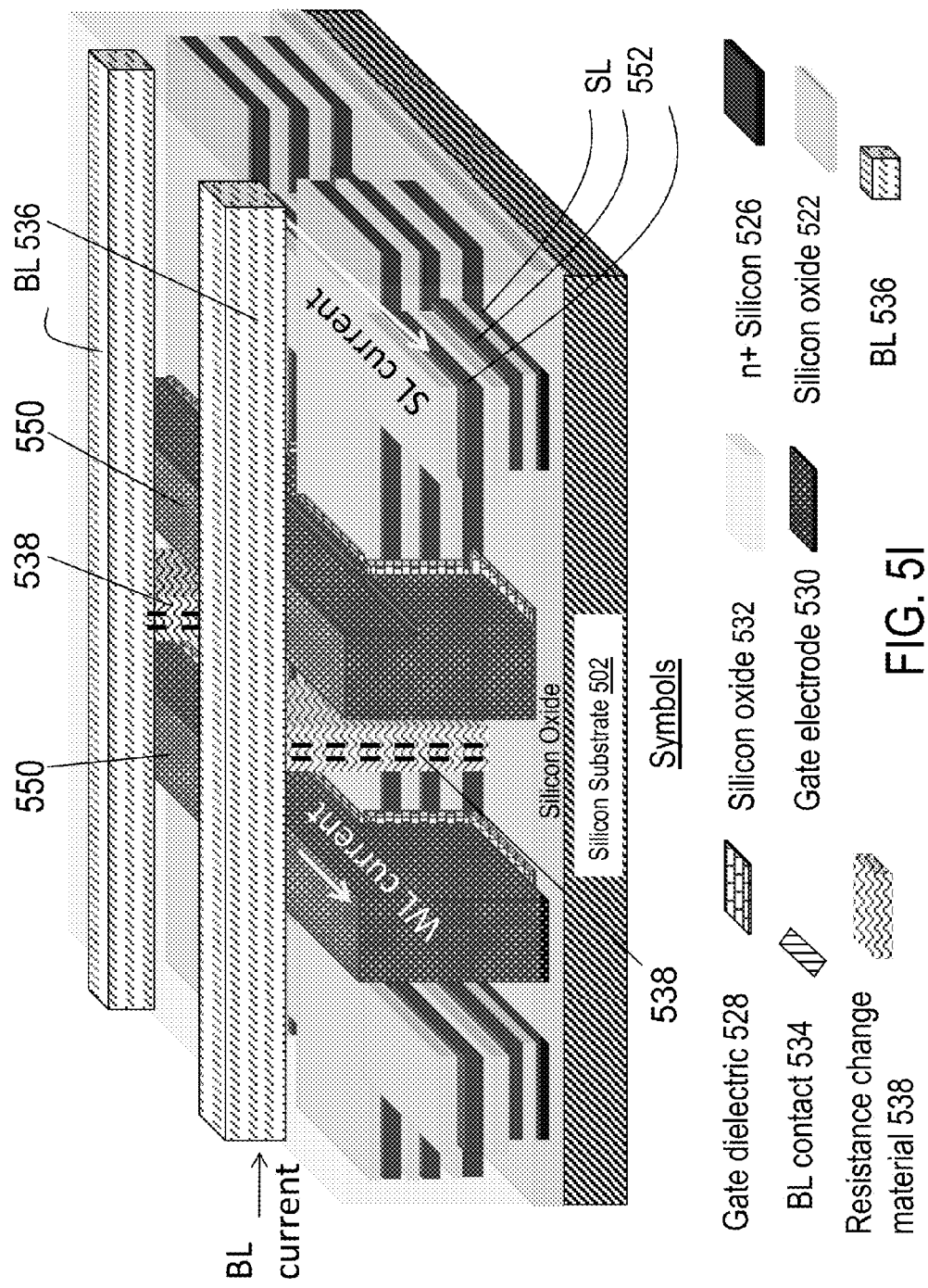

As illustrated in FIG. 5I, BL metal lines 536 may be formed and connected to the associated BL contacts 534 with resistive change material 538. Contacts and associated metal interconnect lines (not shown) may be formed for the WL and SL at the memory array edges.

Figure 5J:
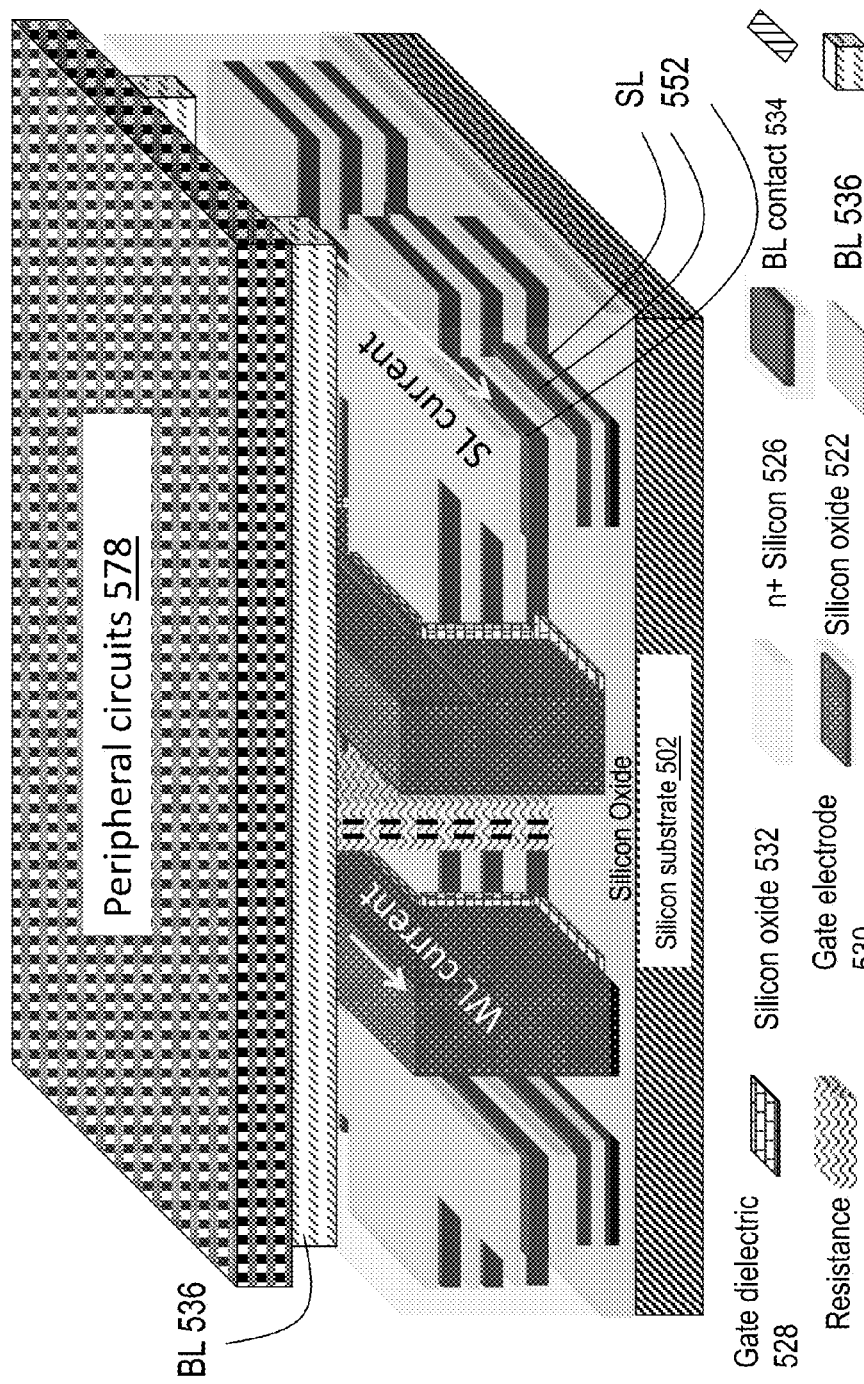

As illustrated in FIG. 5J, peripheral circuits 578 may be constructed and then layer transferred, using methods described previously such as, for example, ion-cut with replacement gates, to the memory array, and then thru layer vias (not shown) may be formed to electrically couple the periphery circuitry to the memory array BL, WL, SL and other connections such as, for example, power and ground. Alternatively, the periphery circuitry may be formed and directly aligned to the memory array and silicon substrate 502 utilizing the layer transfer of wafer sized doped layers and subsequent processing, such as, for example, the junction-less, RCAT, V-groove, or bipolar transistor formation flows as previously described.

This flow may enable the formation of a resistance-based multi-layer or 3D memory array with zero additional masking steps per memory layer, which utilizes poly-crystalline silicon junction-less transistors and has a resistance-based memory element in series with a select transistor, and is constructed by layer transfers of wafer sized doped poly-crystalline silicon layers, and this 3D memory array may be connected to an overlying multi-metal layer semiconductor device or periphery circuitry.

Persons of ordinary skill in the art will appreciate that the illustrations in FIGS. 5A through 5J are exemplary only and are not drawn to scale. Such skilled persons will further appreciate that many variations are possible such as, for example, the RTAs and/or optical anneals of the N+ doped poly-crystalline or amorphous silicon layers 506 as described for FIG. 5D may be performed after each Si/SiO2 layer is formed in FIG. 5C. Additionally, N+ doped poly-crystalline or amorphous silicon layer 506 may be doped P+, or with a combination of dopants and other polysilicon network modifiers to enhance the RTA or optical annealing crystallization and subsequent crystallization, and lower the N+ silicon layer 516 resistivity. Moreover, doping of each crystallized N+ layer may be slightly different to compensate for interconnect resistances. Besides, each gate of the double gated 3D resistance based memory can be independently controlled for better control of the memory cell. Furthermore, by proper choice of materials for memory layer transistors and memory layer wires (e.g., by using tungsten and other materials that withstand high temperature processing for wiring), standard CMOS transistors may be processed at high temperatures (e.g., >700° C.) to form the periphery circuitry 578. Many other modifications within the scope of the invention will suggest themselves to such skilled persons after reading this specification. Thus the invention is to be limited only by the appended claims.

Figure 6:
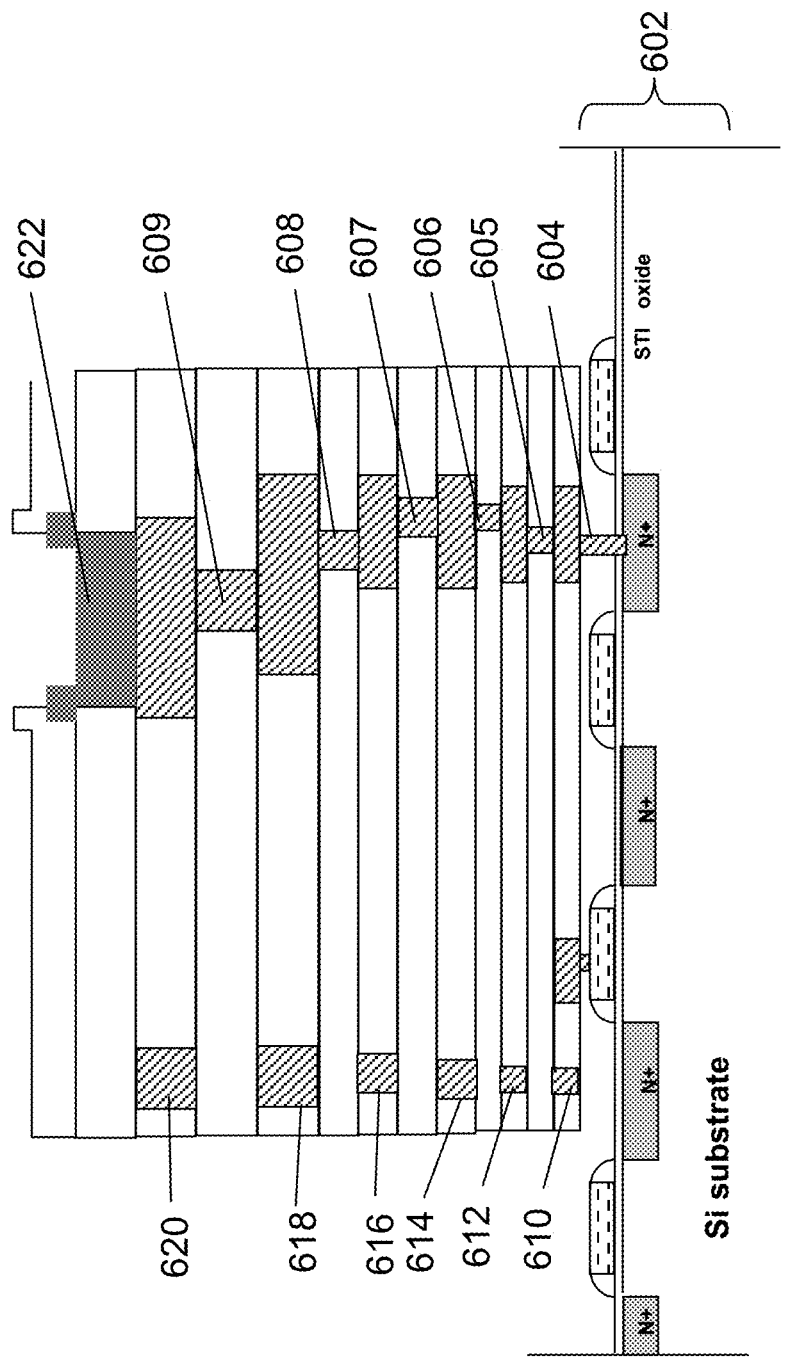
FIG. 6 is a drawing illustration of a metal interconnect stack prior art.

Additionally, when circuit cells are built on two or more layers of thin silicon as shown above, and enjoy the dense vertical thru silicon via interconnections, the metallization layer scheme to take advantage of this dense 3D technology may be improved as follows. FIG. 6 illustrates the prior art of silicon integrated circuit metallization schemes. The conventional transistor silicon layer 602 is connected to the first metal layer 610 thru the contact 604. The dimensions of this interconnect pair of contact and metal lines generally are at the minimum line resolution of the lithography and etch capability for that technology process node. Traditionally, this is called a "1×" design rule metal layer. Usually, the next metal layer is also at the "1×" design rule, the metal line 612 and via below 605 and via above 606 that connects metals 612 with 610 or with 614 where desired. Then the next few layers are often constructed at twice the minimum lithographic and etch capability and called '2×' metal layers, and have thicker metal for higher current carrying capability. These are illustrated with metal line 614 paired with via 607 and metal line 616 paired with via 608 in FIG. 6. Accordingly, the metal via pairs of 618 with 609, and 620 with bond pad opening 622, represent the '4×' metallization layers where the planar and thickness dimensions are again larger and thicker than the 2× and 1× layers. The precise number of 1× or 2× or 4× layers may vary depending on interconnection needs and other requirements; however, the general flow is that of increasingly larger metal line, metal space, and via dimensions as the metal layers are farther from the silicon transistors and closer to the bond pads.

Figure 7:
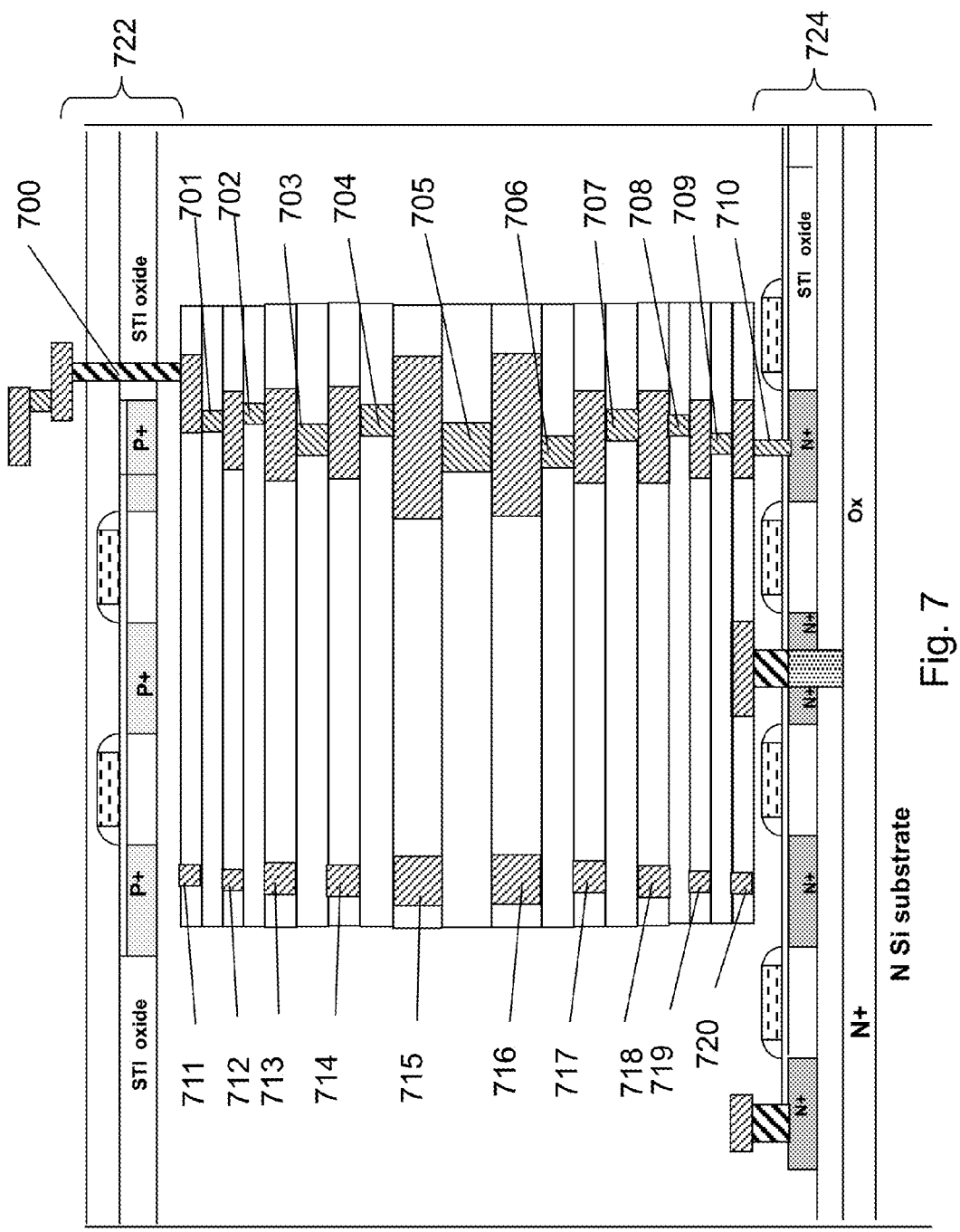
FIG. 7 is a drawing illustration of a metal interconnect stack.

The metallization layer scheme may be improved for 3D circuits as illustrated in FIG. 7. The first mono- or poly-crystalline silicon device layer 724 is illustrated as the NMOS silicon transistor layer from the above 3D library cells, but may also be a conventional logic transistor silicon substrate or layer. The '1×' metal layers 720 and 719 are connected with contact 710 to the silicon transistors and vias 708 and 709 to each other or metal line 718. The 2× layer pairs metal 718 with via 707 and metal 717 with via 706. The 4× metal layer 716 is paired with via 705 and metal 715, also at 4×. However, now via 704 is constructed in 2× design rules to enable metal line 714 to be at 2×. Metal line 713 and via 703 are also at 2× design rules and thicknesses. Vias 702 and 701 are paired with metal lines 712 and 711 at the 1× minimum design rule dimensions and thickness. The thru silicon via 700 of the illustrated PMOS layer transferred silicon 722 may then be constructed at the 1× minimum design rules and provide for maximum density of the top layer. The precise numbers of 1× or 2× or 4× layers may vary depending on circuit area and current carrying metallization design rules and tradeoffs. The layer transferred top transistor layer 722 may be any of the low temperature devices illustrated herein.

Some embodiments of the current invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices such as mobile phones, smart phone, cameras and the like. For example, incorporating the 3D IC semiconductor devices according to some embodiments of the present invention within these mobile electronic devices could provide superior mobile units that could operate much more efficiently and for a much longer time than with prior art technology.

3D ICs according to some embodiments of the current invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the current invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduced NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system, including using multiple devices wherein more than one device incorporates elements of the invention. An end system could benefits from memory device utilizing the invention 3D memory together with high performance 3D FPGA together with high density 3D logic and so forth. Using devices that use one or multiple elements of the invention would allow for better performance and or lower power and other advantages resulting from the inventions to provide the end system with a competitive edge. Such end system could be electronic based products or other type of systems that include some level of embedded electronics, such as, for example, cars, remote controlled vehicles, etc.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr_024377. To achieve the lowest nickel silicide contact and source/drain resistances, the nickel on silicon must be heated to at least 450° C.

Thus it may be desirable to enable low resistances for process flows in this document where the post layer transfer temperature exposures must remain under approximately 400° C. due to metallization, such as, for example, copper and aluminum, and low-k dielectrics present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

We claim:
1. A semiconductor memory, comprising:
a first memory cell comprising a first transistor;
a second memory cell comprising a second transistor; and
a memory peripherals transistor overlaying said second transistor or underneath said first transistor,
wherein said second memory cell overlays said first memory cell,
wherein said first memory cell and said second memory cell have both been processed following a lithography step and accordingly are precisely aligned, and
wherein said memory peripherals transistor is part of a peripherals circuit controlling said memory.
2. The semiconductor memory according to claim 1, wherein said second transistor comprises a single crystal channel.
3. The semiconductor memory according to claim 1, wherein said first transistor is a polysilicon transistor.
4. The semiconductor memory according to claim 1, wherein said first transistor is a junction-less transistor.
5. The semiconductor memory according to claim 1, further comprising:
an isolation layer disposed between said memory peripherals transistor and said first transistor.
6. The semiconductor memory according to claim 1, wherein said memory peripherals transistor comprises a single crystal channel.
7. The semiconductor memory according to claim 1, wherein said first transistor and said memory peripherals transistor have a misalignment to each other of less than 40 nm.
8. A semiconductor memory, comprising:
a first memory cell comprising a first transistor;
a second memory cell comprising a second transistor; and
a memory peripherals transistor overlaying said second transistor or underneath said first transistor,
wherein said second memory cell overlays said first memory cell,
wherein said first memory cell and said second memory cell have both been processed following a lithography step and accordingly are precisely aligned, and
wherein said first transistor and said memory peripherals transistor have a misalignment to each other of less than 40 nm.
9. The semiconductor memory according to claim 8, wherein said second transistor comprises a single crystal channel.
10. The semiconductor memory according to claim 8, wherein said first transistor is a polysilicon transistor.
11. The semiconductor memory according to claim 8, wherein said first transistor is a junction-less transistor.
12. The semiconductor memory according to claim 8, further comprising:
an isolation layer disposed between said memory peripherals transistor and said first transistor.
13. The semiconductor memory according to claim 8, wherein said memory peripherals transistors comprises a single crystal channel.
14. The semiconductor memory according to claim 8, wherein said memory peripherals transistor is part of a peripherals circuit controlling said memory.
15. A semiconductor memory, comprising:
a first memory cell comprising a first transistor;

a second memory cell comprising a second transistor; and
a memory peripherals transistor overlaying said second transistor or underneath said first transistor,
   wherein said second memory cell overlays said first memory cell,
   wherein said first memory cell and said second memory cell have both been processed following a lithography step and accordingly are precisely aligned, and
   wherein said memory peripherals transistor comprises a single crystal channel and is part of a peripherals circuit controlling said memory.

16. The semiconductor memory according to claim 15, wherein said second transistors comprises a single crystal channel.

17. The semiconductor memory according to claim 15, wherein said first transistor is a polysilicon transistor.

18. The semiconductor memory according to claim 15, wherein said first transistor is a junction-less transistor.

19. The semiconductor memory according to claim 15, further comprising:
an isolation layer disposed between said memory peripherals transistor and said first transistor,
   wherein said isolation layer comprises a via having a radius of less than 400 nm.

20. The semiconductor memory according to claim 15, wherein said first transistor and said memory peripherals transistor have a misalignment to each other of less than 40 nm.

\* \* \* \* \*